(12) United States Patent
Scala et al.

(10) Patent No.: US 10,060,045 B2
(45) Date of Patent: Aug. 28, 2018

(54) FABRICATION OF INDIUM-DOPED SILICON BY THE CZOCHRALSKI METHOD

(71) Applicant: Corner Star Limited, Kowloon (HK)

(72) Inventors: Roberto Scala, Novara (IT); Luigi Bonanno, Novara (IT); Stephan Haringer, Novara (IT); Armando Giannattasio, Novara (IT); Valentino Moser, Novara (IT); Jesse Samsonov Appel, O'Fallon, MO (US); Martin Jeffrey Binns, St. Charles, MO (US)

(73) Assignee: Corner Star Limited, Kowloon (HK)

( * ) Notice: Subject to any disclaimer, the term of this patent is extended or adjusted under 35 U.S.C. 154(b) by 118 days.

(21) Appl. No.: 14/758,471

(22) PCT Filed: Dec. 27, 2013

(86) PCT No.: PCT/US2013/078046
§ 371 (c)(1),
(2) Date: Jun. 29, 2015

(87) PCT Pub. No.: WO2014/106080
PCT Pub. Date: Jul. 3, 2014

(65) Prior Publication Data
US 2016/0215413 A1 Jul. 28, 2016

Related U.S. Application Data

(60) Provisional application No. 61/838,660, filed on Jun. 24, 2013.

(30) Foreign Application Priority Data

Dec. 31, 2012 (IT) .............................. TO2012A1175
Mar. 11, 2013 (WO) ................. PCT/EP2013/054875
Mar. 11, 2013 (WO) ................. PCT/EP2013/054878

(51) Int. Cl.
| | | |
|---|---|---|
| C03B 15/04 | (2006.01) |
| C30B 15/04 | (2006.01) |
| H01L 31/0236 | (2006.01) |
| H01L 31/028 | (2006.01) |
| H01L 31/036 | (2006.01) |
| C30B 15/20 | (2006.01) |
| C30B 29/06 | (2006.01) |
| H01L 31/0288 | (2006.01) |

(52) U.S. Cl.
CPC .............. *C30B 15/04* (2013.01); *C30B 15/20* (2013.01); *C30B 29/06* (2013.01); *H01L 31/028* (2013.01); *H01L 31/0288* (2013.01); *H01L 31/02363* (2013.01); *H01L 31/036* (2013.01)

(58) Field of Classification Search
CPC .......... C30B 15/04; C30B 15/20; C30B 29/06
See application file for complete search history.

(56) References Cited

U.S. PATENT DOCUMENTS

| | | |
|---|---|---|
| 4,547,258 A | 10/1985 | Witter et al. |
| 5,242,531 A | 9/1993 | Klingshirn et al. |
| 5,866,094 A | 2/1999 | Niikura |
| 6,063,188 A | 5/2000 | Heid |
| 6,899,760 B2 | 5/2005 | Choi et al. |
| 8,283,241 B2 | 10/2012 | Narushima et al. |
| 2001/0015167 A1 | 8/2001 | Weber et al. |
| 2004/0069214 A1 | 4/2004 | Choi et al. |
| 2004/0083947 A1 | 5/2004 | Weber et al. |
| 2007/0089781 A1 | 4/2007 | Kida et al. |
| 2009/0039478 A1 | 2/2009 | Bucher et al. |
| 2010/0071612 A1* | 3/2010 | Narushima ............. C30B 15/20 117/21 |
| 2010/0151667 A1 | 6/2010 | Narushima et al. |
| 2012/0056135 A1 | 3/2012 | DeLuca et al. |

FOREIGN PATENT DOCUMENTS

| | | |
|---|---|---|
| CN | 101805925 A | 8/2010 |
| DE | 102009034317 A1 | 2/2011 |
| JP | S59156993 A | 9/1984 |
| JP | 2005272265 A | 10/2005 |
| JP | 2005336020 A | 12/2005 |
| JP | 2012066965 A | 4/2012 |

(Continued)

OTHER PUBLICATIONS

Binns, M. J. et al., Indium-Doped Mono-Crystalline Silicon Substrates Exhibiting Negligible Lifetime Degradation Following Light Soaking, Photovoltaic Specialist Conference (PVSC) IEEE 42nd, 2015, pp. 6.
Machine Translation of JP2012-066965; pp. 1-7.
Keevers, M. J. et al., Extended Infrared Response of Silicon Solar Cells and the Impurity Photovoltaic Effect, IEEE, First WCPEC, Dec. 5-9, 1994; pp. 1433-1436.
Hobgood, H.M., et al., Growth and Characterization of Indium-Doped Silicon for Extrinsic IR Detectors, IEEE Transactions on Electron Devices, Jan. 1980, pp. 14-23, vol. 27, No. 1.
Linares, L.C., et al., An Improved Model for Analyzing Hole Mobility and Resistivity in p-Type Silicon Doped with Boron, Gallium, and Indium, J. Electronchem Soc. Solid-State Science and Technology, Mar. 1981, pp. 601-608, vol. 128, No. 3.
International Search Report and Written Opinion of the International Searching Authority regarding PCT/EP2013/054878 dated Jun. 7, 2013; pp. 5.

(Continued)

*Primary Examiner* — Margaret G Moore
(74) *Attorney, Agent, or Firm* — Armstrong Teasdale LLP

(57) ABSTRACT

A method of growing a monocrystalline silicon ingot is described. The method includes the steps of providing a monocrystalline ingot growing apparatus including a chamber having an internal pressure, and a crucible disposed within the chamber, preparing a silicon melt in the crucible, introducing an inert gas into the chamber from a gas inlet above the silicon melt, wherein the inert gas flows over the surface of the silicon melt and has a flow rate, introducing a volatile dopant including indium into the silicon melt, growing an indium-doped monocrystalline silicon ingot, and controlling the indium dopant concentration in the ingot by adjusting the ratio of the inert gas flow rate and the internal pressure of the chamber.

22 Claims, 19 Drawing Sheets

(56) References Cited

FOREIGN PATENT DOCUMENTS

| JP | 2013539451 | A1 | 10/2013 |
|---|---|---|---|
| WO | 9428207 | A1 | 12/1994 |
| WO | 2000073542 | A | 12/2000 |
| WO | 0144542 | A1 | 6/2001 |
| WO | 2002015284 | A1 | 2/2002 |
| WO | 2011100879 | A1 | 8/2011 |
| WO | 2013045767 | A1 | 4/2013 |

OTHER PUBLICATIONS

Written Opinion of the International Searching Authority regarding PCT/EP2013/054878 dated Jun. 7, 2013; pp. 9.
Kasai, Hiroto, et al., Study for improvement of solar cell efficiency by impurity photovoltaic effect; Solar Energy Material and Solar Cells; 1997, pp. 93-100; vol. 48.
International Search Report and Written Opinion of the International Searching Authority regarding PCT/EP2013/054875 dated Jun. 7, 2013; pp. 5.
Written Opinion of the International Searching Authority regarding PCT/EP2013/054875 dated Jun. 7, 2013; pp. 10.
Examination Report and Written Opinion regarding Italian Patent Application No. 1020121175 dated Apr. 10, 2013; pp. 9.
International Search Report and Written Opinion of the International Searching Authority regarding PCT/EP2013/078163 dated Feb. 17, 2014; pp. 11.
International Search Report and Written Opinion of the International Searching Authority regarding PCT/US2013/078056 dated Feb. 17, 2014; pp. 17.
International Search Report and Written Opinion of the International Searching Authority regarding PCT/US2013/078046 dated Feb. 17, 2014; pp. 15.
Schelter, W. et al., Optical properties of indium-doped silicon reinspected, J. Phys. C: Solid State Phys., 1982, pp. 5839-5850, vol. 15.
Mitchard, G.S. et al., Observation of Long Lifetime Lines in Photoluminescence from Si:In, Solid State Communication 1979, pp. 425-429, vol. 29, Pergamon Press Ltd, Great Britain.
Keevers, M.J. et al., Efficiency improvements of silicon solar cells by the impurity photovoltaic effect, J. Appl. Phys., Apr. 15, 1994, pp. 4022-4031, vol. 75, No. 8.
Karazhanov, S. ZH., Impurity photovoltaic effect in indium-doped silicon solar cells, J. App. Phys., 2001, pp. 4030-4036, vol. 89, No. 7.
Jones, C.E, et al., Studies of Indium-Doped Silicon, Honeywell Corporate Materials Science Center, Bloomington, MN, Report, Jun. 1980, Accession No. ADA088736, pp. 130.
Jones, C.E. et al., Deep level transient spectroscopy studies of trapping parameters for centers in indium-doped silicon, J. Appl. Phys. Aug. 1981, pp. 5159-5163, vol. 52, No. 8.
Henry, A., et al., Photoluminescence characterisation of indium-doped and undoped silicon layers grown by molecular beam epitaxy, Semicond. Sci. Technol., 1990, pp. 340-344, vol. 5, IPO Publishing Ltd., United Kingdom.
Endros, A.L., Mono- and tri-crystalline Si for PV Applications, Solar Energy Materials & Solar Cells, 2002, pp. 109-124, vol. 72, Elsevier Science B.V.
Ciszeik, T.F., Material Considerations for High Efficiency Silicon Solar Cells, Solar Cells, 1987, pp. 81-98, vol. 21, Elsevier Sequoia, Netherlands.
Bhatia, K.L., Optical Study of Silicon Doubly Doped with Boron and Indium Acceptors, Canadian Journal of Physics, Mar. 22, 1971, pp. 2230-2236, vol. 49.
Baron, R. et al., Nature of the 0.111-eV acceptor level in indium-doped silicon, Appl. Phys. Lett., Feb. 15, 1979, pp. 257-259, vol. 34, No. 4, American Institute of Physics.
Office Action issued in connection with Japanese Patent Application No. 2015-550811, dated Dec. 5, 2017 and unofficial translation thereof, pp. 1-7.

* cited by examiner

FABRICATION OF INDIUM-DOPED SILICON BY THE CZOCHRALSKI METHOD

CROSS-REFERENCE TO RELATED APPLICATIONS

This application is a National Stage application of International Application No. PCT/US2013/078046, filed on Dec. 27, 2013, which claims priority to Italian Application No. TO2012A001175 filed Dec. 31, 2012, International Application No. PCT/EP2013/054878 filed Mar. 11, 2013, International Application No. PCT/EP2013/054875 filed Mar. 11, 2013, and U.S. Patent Application No. 61/838,660 filed Jun. 24, 2013, the disclosures of which are hereby incorporated by reference in their entirety.

FIELD

The field relates generally to the manufacture of solar cells fabricated on monocrystalline silicon wafers, and more specifically to solar cells fabricated on indium-doped monocrystalline silicon wafers sliced from Czochralski grown monocrystalline silicon ingots.

BACKGROUND

Single crystal silicon, which is the starting material in most processes for the fabrication of semiconductor electronic components, is commonly prepared by the so-called Czochralski ("Cz") method. In this method, polycrystalline silicon ("polysilicon") is charged to a crucible and melted, a seed crystal is brought into contact with the molten silicon, and then a single crystal is grown by slow extraction. After formation of a neck is complete, the diameter of the crystal is enlarged by, for example, decreasing the pulling rate and/or the melt temperature until the desired or target diameter is reached. The cylindrical main body of the crystal which has an approximately constant diameter is then grown by controlling the pull rate and the melt temperature while compensating for the decreasing melt level. Near the end of the growth process but before the crucible is emptied of molten silicon, the crystal diameter is typically reduced gradually to form a tail end in the form of an end-cone. The end-cone usually is formed by increasing the crystal pull rate and heat supplied to the crucible. When the diameter becomes small enough, the crystal is then separated from the melt.

Solar cells may be fabricated from monocrystalline silicon substrates produced by the Czochralski method. Czochralski grown monocrystalline silicon substrates may be grown by either standard, i.e., batch, or continuous. In order to achieve acceptable resistivity for solar cell applications, the growing crystal is doped primarily with boron. It is the industry standard for diffused junction screen-printed solar cells to use boron-doped silicon wafers.

The use of boron-doped silicon wafers is not without problems. For example, it is known that oxygen impurity, commonly caused by the crucible, of a Czochralski grown crystal can interact with boron dopants forming complexes in the material. These oxygen complexes are activated when the substrate or finished solar cell is exposed to light, which degrades its minority carrier lifetime, and hence the efficiency of the completed solar cell. This phenomenon is called light induced degradation (LID), and is a major loss mechanism for solar cells fabricated on boron-doped monocrystalline silicon wafers.

In order to minimize the effect of LID, manufacturers target a slightly higher resistivity than optimal to reduce the amount of boron dopant atoms in each wafer. Therefore, there is a trade-off between LID and optimal base resistivity. Consequently, the maximum efficiency of solar cell cannot be realized.

BRIEF DESCRIPTION

Briefly, therefore, one aspect is directed to a solar cell comprising an indium-doped monocrystalline silicon wafer sliced from an ingot grown by the Czochralski method, wherein the efficiency of converting solar spectral irradiance on a surface of the indium-doped monocrystalline silicon wafer under an absolute air mass of 1.5 is at least 17%.

Another aspect is directed to a solar cell comprising an indium-doped monocrystalline silicon wafer sliced from an ingot grown by the Czochralski method, wherein the wafer has an average bulk resistivity less than about 10 ohm-cm and wherein the relative efficiency of the solar cell degrades by no more than about 1% after 1 hour to 300 hours exposure to light equivalent to 0.1 suns to 10 suns at a temperature less than 45° C.

Still another aspect is directed to a solar cell comprising an indium-doped monocrystalline silicon wafer sliced from an ingot grown by the Czochralski method, wherein the wafer has an average bulk resistivity less than about 10 ohm-cm and wherein the relative efficiency of the solar cell degrades by no more than about 1% after at least 4 hours exposure to sunlight at a temperature less than 45° C.

Yet another aspect is directed to a monocrystalline silicon segment having a central axis, a front surface and a back surface that are generally perpendicular to the central axis, a central plane between and parallel to the front and back surfaces, a circumferential edge, and a radius, R, extending from the central axis to the circumferential edge, the segment comprising a mean indium concentration of at least about $1 \times 10^{15}$ atoms/cubic centimeters; wherein the indium concentration has a relative radial variance of no more than about 15% over at least 0.75R.

Another aspect is directed to a monocrystalline silicon wafer having a thickness between about 100 micrometers and about 1000 micrometers and two major dimensions between about 50 mm and about 300 mm, the monocrystalline silicon wafer comprising a mean indium concentration of at least about $1 \times 10^{15}$ atoms/cubic centimeters; wherein the indium concentration has a variance of no more than about 15% over at least 75% of the length of either of the two major dimensions.

Yet another aspect is directed to a method of growing a single crystal silicon ingot comprising the steps of providing a single crystal ingot growing apparatus, wherein the growing apparatus includes a chamber having an internal pressure and a crucible disposed within the chamber, preparing a silicon melt in the crucible, introducing an inert gas into the chamber from a gas inlet above the silicon melt, wherein the inert gas flows over the surface of the silicon melt and has a flow rate, introducing a volatile dopant into the silicon melt, wherein the volatile dopant includes indium, growing an indium-doped single crystal silicon ingot, wherein the indium-doped single crystal silicon ingot has an indium dopant concentration, and controlling the indium dopant concentration in the ingot by adjusting the ratio of the inert gas flow rate and the internal pressure of the chamber.

Still another aspect is directed to a monocrystalline silicon ingot having a central axis, a circumferential edge, a radius extending from the central axis to the circumferential edge, and a mass, the ingot comprising a mean indium concentration of at least about $5 \times 10^{14}$ atoms per cubic centimeter and an axial variance of indium concentration of less than about $5 \times 10^{14}$ atoms per cubic centimeter over an axial length of over 20 centimeters, wherein the radius of the ingot is greater than about 75 millimeters.

Another aspect is directed to a method of growing a single crystal silicon ingot comprising the steps of providing a single crystal ingot growing apparatus, wherein the growing apparatus includes a chamber having an internal pressure, a crucible disposed within the chamber, and a liquid doping device, preparing a silicon melt in the crucible, introducing an inert gas into the chamber from a gas inlet above the silicon melt, wherein the inert gas flows over the surface of the silicon melt and has a flow rate, introducing a volatile dopant into the silicon melt as a liquid, wherein the volatile dopant includes indium, growing an indium-doped single crystal silicon ingot, wherein the indium-doped single crystal silicon ingot has an indium dopant concentration, and controlling the indium dopant concentration in the ingot by adjusting the ratio of the inert gas flow rate and the internal pressure of the chamber.

DETAILED DESCRIPTION

Figure 1:
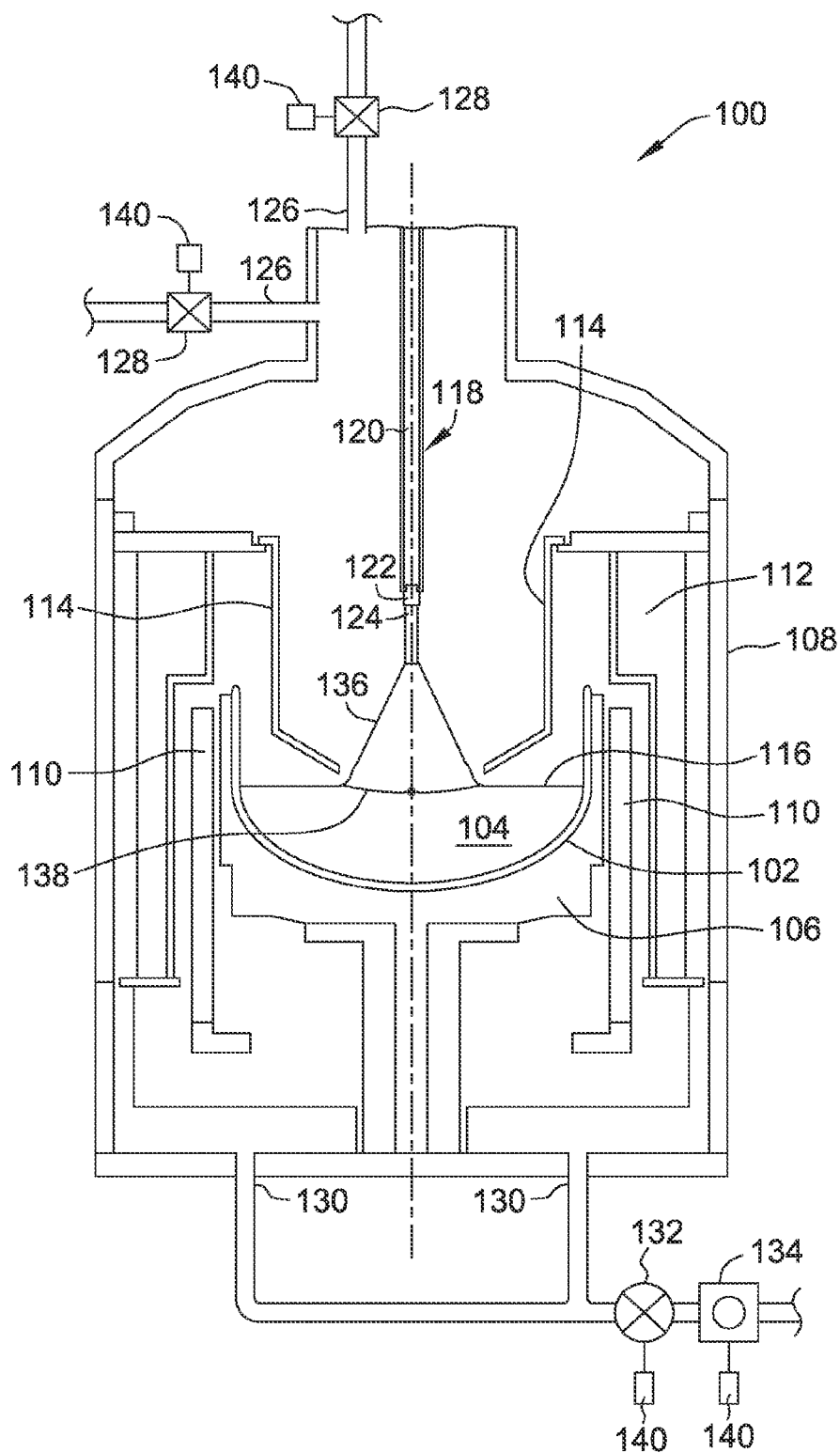
FIG. 1 is a cross-section of a crystal growth chamber.

An indium-doped monocrystalline silicon segment, e.g., a wafer, disclosed herein is sliced from an ingot grown by the Czochralski method. The indium-doped monocrystalline silicon segment is useful in the fabrication of semiconductors and solar cells. Accordingly, in some embodiments, the present disclosure is further directed to a solar cell fabricated on an indium-doped monocrystalline silicon wafer sliced from an ingot grown by the Czochralski method. The indium-doped monocrystalline silicon wafer of the present disclosure is characterized by high efficiency of converting solar spectral irradiance (e.g., sunlight) on a surface thereof. The indium-doped monocrystalline silicon wafer of the present disclosure is characterized, in particular, by high efficiency of converting light in the infrared region of the solar spectrum. Accordingly, the indium-doped monocrystalline silicon wafer of the present disclosure is capable of solar spectral irradiance conversion efficiency of at least 17%, at least 18%, at least 19%, or even at least 20%, as measured under an absolute air mass of 1.5. Advantageously, the light induced degradation of indium-doped monocrystalline silicon wafers according to the present disclosure is substantially less than the LID of conventional boron-doped solar cells. In some embodiments, the relative efficiency of the solar cell degrades by no more than about 1% after exposure to light, e.g., sunlight. Absolute light induced degradation has been observed to be less than 0.5% and in some cases substantially less, such as less than 0.1%. In view thereof, the indium-doped monocrystalline silicon wafer of the present disclosure is particularly suited for use in the manufacture of solar cells.

In some embodiments, the present disclosure is directed to an indium-doped monocrystalline silicon wafer sliced from a Czochralski grown ingot. Advantageously, the Czochralski grown ingot may be grown by a batch Cz process or a continuous Cz process. The use of indium as a dopant in silicon ingots grown by the Czochralski method presents several challenges. Indium is a highly volatile dopant, and has an extremely low segregation coefficient compared to other dopants. For example, indium's segregation coefficient is approximately $4 \times 10^{-4}$, compared to 0.8 for boron. As a result, the indium dopant concentration in the silicon melt can vary by orders of magnitude during a single Czochralski batch growth process. The axial (i.e., along the length of the ingot) dopant concentration in the grown ingot may also vary by orders of magnitude as a result of varying dopant concentration in the silicon melt. Such axial variation is not desirable as the resistivity of wafers taken from the ingot will depend upon their position within the ingot. According to a method of the present disclosure, therefore, conditions may be controlled in either a batch Cz process or a continuous Cz process to ensure uniform indium dopant along the axial length of the single crystal silicon ingot and along the radial length of the wafer as measured from the central axis to the edge.

In some embodiments, the monocrystalline silicon substrate comprises a segment of a single crystal silicon ingot, i.e., a portion sliced from a single crystal silicon ingot. In some embodiments, the monocrystalline silicon substrate comprises a single crystal silicon wafer. In some embodiments, the silicon wafer comprises a wafer sliced from a single crystal silicon wafer which has been sliced from a single crystal ingot grown in accordance with Czochralski crystal growing methods described herein. The single crystal silicon ingot has a nominal diameter achievable by Czochralski crystal growing methods. In general, the nominal diameter may be at least about 150 mm, about 200 mm, or greater than about 200 mm, such as 205 mm, 250 mm, 300 mm or even 450 mm. The indium-doped single crystal silicon wafer may be sliced from the ingot to have the round shape associated with semiconductor applications or may be sliced to have a generally square shape for use in the manufacture of solar cells.

In some embodiments, the indium-doped monocrystalline silicon wafer is prepared for use in a semiconductor application. Ingot growth as well as standard process for preparing wafers for semiconductor manufacture, including silicon slicing, lapping, etching, and polishing techniques, are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference).

In some embodiments, the indium-doped monocrystalline silicon wafer is prepared for use in the manufacture of a solar cell. The wafer may be sliced into generally square shape (see FIG. 7). A semi-square cell starts from a circular wafer but has had the edges cut off so that a number of cells can be more efficiently packed into a rectangular module.

Ingots prepared by the Czochralski method generally contain oxygen impurities, which may enter the silicon melt from the ambient atmosphere and from the crucible wall. During crystal growth, the molten silicon etches or dissolves the quartz that makes up the crucible, thereby generating oxygen doping. The oxygen is dispersed throughout the crystal and can cluster to form precipitates and complexes. Single crystal silicon ingots, and monocrystalline silicon wafers sliced therefrom, may comprise oxygen concentrations up to about 30 PPMA (parts per million atomic, ASTM standard F-121-83 or SEMI standard M44), and generally less than about 20 PPMA, such as between about 11 PPMA and about 20 PPMA.

Ingots prepared by the Czochralski method may also comprise carbon as an impurity. In some embodiments, single crystal silicon ingots, and monocrystalline silicon wafers sliced therefrom, may comprise carbon at a concentration of no more than about 2 ppma.

Figure 6:
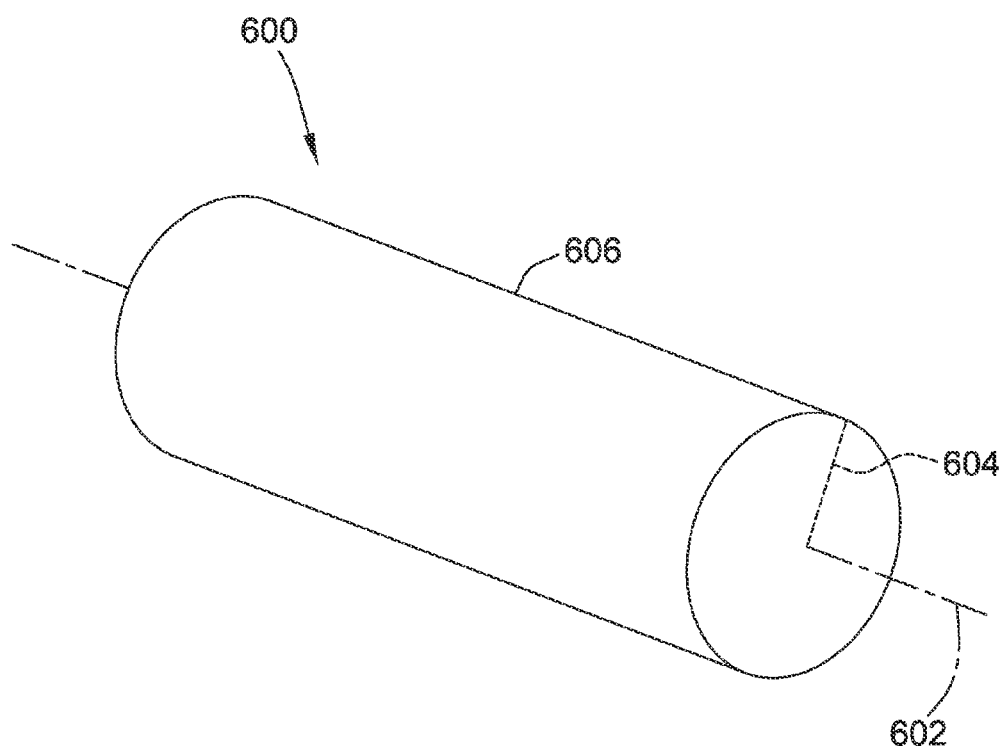
FIG. 6 is a depiction of a monocrystalline silicon ingot grown according to the methods disclosed herein.

In some embodiments, the present disclosure is directed to monocrystalline silicon ingots prepared by the Czochralski method that are doped with indium, such as the ingot shown in FIG. 6. In still further embodiments, the present disclosure is directed to methods for growing such ingots. In still further embodiments, the present disclosure is directed to segments and wafers sliced from such indium-doped Czochralski grown ingots. In some embodiments, the indium-doped monocrystalline silicon substrate comprises a segment, e.g., a wafer, comprising two major, generally parallel surfaces, one of which is a front surface of the substrate and the other of which is a back surface of the substrate, a circumferential edge joining the front and back surfaces, a central plane between the front and back surfaces, and a radius, R, extending from the central plane to the circumferential edge. In some embodiments, the monocrystalline silicon substrate comprises a monocrystalline silicon wafer having a circular shape. The diameter of the wafer is generally similar to the diameter of the Czochralski-grown single crystal silicon ingot, except for the portion of the ingot that is ground, as known in the art, in order to achieve an ingot having a uniform diameter. Ingots are generally grown to a diameter greater than the diameter of the wafer and are typically subjected to grinding in order to smooth the outer circumferential edges thereof, which may reduce the diameter compared to the freshly grown ingot. The diameter of the wafer may be at least about 150 mm, about 200 mm, or greater than about 200 mm, such as 205 mm, 250 mm, 300 mm or even 450 mm, and in some embodiments between about 150 mm and about 450 mm. In some embodiments, the monocrystalline silicon wafer has a thickness between about 100 micrometers and about 1000 micrometers, such as between about 120 micrometers and about 240 micrometers. In specific embodiments, the thickness may be about 180 micrometers, or about 200 micrometers. The thickness may vary by about 20 micrometers lesser or greater than the above recited thickness.

In some embodiments, an indium-doped monocrystalline silicon ingot (which may have been cropped to remove the seed and end cones) or indium-doped monocrystalline silicon segment sliced therefrom (e.g., a wafer) having a central axis, a front surface and a back surface that are generally perpendicular to the central axis, a central plane between and parallel to the front and back surfaces, a circumferential edge, and a radius, R, extending from the central axis to the circumferential edge comprises a mean indium concentration of at least about $5 \times 10^{14}$ atoms/cubic centimeters (about 0.01 PPMA), or at least about $1 \times 10^{15}$ atoms/cubic centimeters, which is about 0.02 PPMA. In some embodiments, the mean indium concentration is between about $1 \times 10^{15}$ atoms/cubic centimeters (about 0.02 PPMA) and about $1 \times 10^{18}$ atoms/cubic centimeters (about 20 PPMA). In some embodiments, the mean indium concentration is between about $1 \times 10^{15}$ atoms/cubic centimeters (about 0.02 PPMA) and about $1 \times 10^{17}$ atoms/cubic centimeters (about 2 PPMA). In some embodiments, the mean indium concentration is between about $1 \times 10^{15}$ atoms/cubic centimeters (about 0.02 PPMA) and about $1 \times 10^{16}$ atoms/cubic centimeters (about 0.2 PPMA).

The Czochralski growth method of the present disclosure enables the preparation of ingots and segments sliced therefrom of substantial axial and radial uniformity of the indium concentration. Accordingly, in some embodiments, the ingot or segment sliced therefrom has a relative radial variance of the indium concentration of no more than about 15% over at least 0.75R (i.e., at least 75% of the radius of the ingot or segment). In some embodiments, the ingot or segment sliced therefrom has a relative radial variance of the indium concentration of no more than about 10% over at least 0.75R (i.e., at least 75% of the radius of the ingot or segment). In some embodiments, the ingot or segment sliced therefrom has a relative radial variance of the indium concentration of no more than about 15% over at least 0.95R (i.e., at least 95% of the radius of the ingot or segment). "Relative radial variance" is determined by measuring the change in indium concentration between two points that are located a given distance apart along the radial length of the monocrystalline silicon ingot as measured from the central axis of the wafer to the circumferential edge divided by the indium concentration as measured at the point closest to the central axis of the monocrystalline silicon wafer. This resultant value is multiplied by 100 in order to arrive at a percentage. This percentage is the "relative radial variance" in indium concentration at disclosed herein.

In the solar cell industry, the single crystal silicon ingot is generally cut to have four flat edges, wherein each edge is of substantially identical length. Accordingly, the solar cell comprises a monocrystalline silicon wafer that is generally square shaped. In some embodiments, the monocrystalline silicon wafer is generally square shaped and has rounded edges See FIG. 7, which is a depiction of a monocrystalline silicon wafer having the industry standard square shape of solar cells. The square shaped monocrystalline silicon wafer may comprise rounded edges, having a radius, R, as measured from the central axis to the circumferential edge that are essentially identical to the diameters of the Czochralski-grown single crystal silicon ingot. In some embodiments, the monocrystalline silicon wafers have a thickness between about 100 micrometers and about 1000 micrometers, such as between about 120 micrometers and about 240 micrometers. In specific embodiments, the thickness may be about 180 micrometers, or about 200 micrometers. The thickness may vary by about 20 micrometers lesser or greater than the above recited thickness. The length of the two major dimensions of the ingot (i.e., flat to flat) may be between about 50 mm and about 300 mm, such as between about 100 mm and about 200 mm. In some embodiments, the flat to flat dimensions of the two major dimensions may each be about 125 mm (±0.5 millimeters). In some embodiments, the flat to flat dimensions of the two major dimensions may each be about 156 mm (±0.5 millimeters). The rounded edges may have lengths of between about 10 mm and about 20 mm, such as about 15.4 mm±1.0 millimeter.

Figure 7:
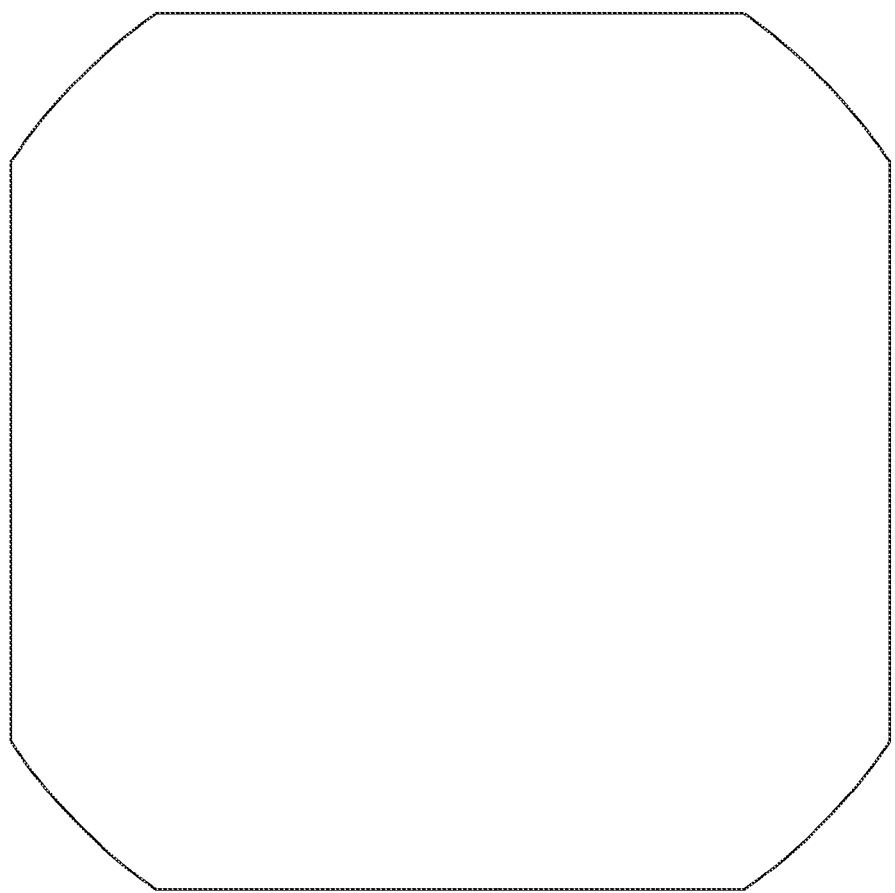
FIG. 7 is a depiction of a monocrystalline silicon wafer of an embodiment.

As mentioned above, indium-doped monocrystalline silicon ingots for use in the manufacture of solar cells are generally cropped to have flat edges, such that wafers sliced therefrom are generally square shaped with rounded corners, as shown in FIG. 7. The square shaped indium-doped monocrystalline silicon wafer of the present disclosure comprises a mean indium concentration of at least about $5 \times 10^{14}$ atoms/cubic centimeters (about 0.01 PPMA), or at least about $1 \times 10^{15}$ atoms/cubic centimeters, which is about 0.02 PPMA. In some embodiments, the mean indium concentration is between about $1 \times 10^{15}$ atoms/cubic centimeters (about 0.02 PPMA) and about $1 \times 10^{18}$ atoms/cubic centimeters (about 20 PPMA). In some embodiments, the mean indium concentration is between about $1 \times 10^{15}$ atoms/cubic centimeters (about 0.02 PPMA) and about $1 \times 10^{17}$ atoms/cubic centimeters (about 2 PPMA). In some embodiments, the mean indium concentration is between about $1 \times 10^{15}$ atoms/cubic centimeters (about 0.02 PPMA) and about $1 \times 10^{16}$ atoms/cubic centimeters (about 0.2 PPMA). The square shaped wafer may have a variance of indium concentration of no more than about 15% over at least 75% of the length of either of the two major dimensions. In some embodiments, the indium concentration of the wafer has a variance of no more than about 15% over at least 75% of the length of both of the two major dimensions. In still further embodiments, the indium concentration has a variance of no more than about 10% over at least 75% of the length of both of the two major dimensions. In still further embodiments, the indium concentration has a variance of no more than about 15% over at least 95% of the length of both of the two major dimensions.

The solar cells of the present disclosure comprising monocrystalline silicon wafers having indium dopant concentrations as set forth herein generally have an average bulk resistivity less than about 10 ohm-cm. In some embodiments, the average bulk resistivity less than about 5 ohm-cm, less than about 4 ohm-cm, less than about 3 ohm-cm, less than about 1 ohm-cm, or even less than about 0.5 ohm-cm.

According to a process of one embodiment, an indium-doped monocrystalline silicon ingot is grown by the Czochralski method. In some embodiments, an indium-doped monocrystalline silicon ingot is grown by the batch Czochralski method. In some embodiments, an indium-doped monocrystalline silicon ingot is grown by the continuous Czochralski method.

Indium-doped monocrystalline silicon ingots according to the present disclosure are generally grown in a Czochralski-growth system and are grown according to the Voronkov theory. See, e.g., WO 1998/45508; WO 1998/45509; WO 1998/45510; and WO 2000/022196; among other applications assigned to MEMC Electronic Materials. In one embodiment, the Czochralski growth chamber comprises a crucible, a system for the delivery of silicon during ingot growth, and a system for the delivery of indium during ingot growth. The crucible can be any known for use in silicon crystal growing that is capable of containing both solid and liquid silicon feedstock. For example, the crucible can be a quartz crucible or can be a graphite crucible containing a quartz inner liner. The crucible can also have any cross-sectional shape depending, for example, on the geometry of the crystal growth system, but typically has a circular cross-sectional shape. The crucible suitably comprises an inner growth zone and an outer feed zone, and these zones are in fluid communication with each other. In some embodiments, the crucible can comprise a wall or other separating means that divides the crucible into the inner and outer zones. The wall may comprise a means for the delivery of silicon and/or indium during growth of the monocrystalline ingot.

In some embodiments, the indium-doped single crystal silicon ingot may be grown by the continuous Czochralski method. Silicon sources for forming the initial melt or for supplementing the silicon melt during ingot growth include electronic grade silicon, metallurgical grade silicon, or solar grade silicon. The silicon may be added as granular polycrystalline silicon or as polycrystalline chunks. In order to supplement the silicon melt as the ingot is pulled, the silicon delivery system comprises means to heat the added silicon such that the silicon melt is supplemented with molten silicon. In some embodiments, the silicon can be delivered in either solid or molten form.

The continuous Czochralski growth system of the present disclosure further comprises a means for delivering indium to the crucible, both in the silicon of the initial melt and for supplementing the silicon melt as the ingot is pulled. The indium can be delivered separately from the silicon supplement, or the indium may be provided in the silicon supplement. Continuous Czochralski growth comprises supplementation, either continuous or intermittent, of the silicon melt with silicon and indium may occur to ensure that the relative concentration of indium in the melt remains relatively constant and to further ensure that the silicon melt level remains relatively constant as silicon in the melt solidifies into the growing single crystal.

In some embodiments, the method for growing an indium-doped single crystal silicon ingot comprises batch Czochralski. Silicon stock material for forming the initial melt in the batch Czochralski method may include electronic grade silicon, metallurgical grade silicon, or solar grade silicon. The silicon stock material may be granular polycrystalline silicon or polycrystalline chunks, for example.

Suitable methods for growing an indium-doped monocrystalline silicon ingot suitable for fabricating the indium-doped wafers and solar cells described herein will now be described with reference to FIGS. 1-5. Other methods are contemplated within the scope of this disclosure.

A Czochralski growth chamber suitable for growing the indium-doped ingots described herein is indicated generally at 100 in FIG. 1. The growth chamber 100 includes a crucible 102 for holding a melt 104 of semiconductor or solar-grade material, such as silicon, surrounded by a susceptor 106 contained within a furnace 108. The semiconductor or solar-grade material is melted by heat provided from a heating element 110 surrounded by insulation 112. Heat shields or reflectors 114 may be disposed above the melt surface 116 to provide better thermal distribution within the growth chamber 100.

A pulling mechanism 118 is provided within the growth chamber for growing and pulling ingots out of the melt 104. The pulling mechanism includes a pulling cable 120, a seed holder or chuck 122 disposed at the end of the pulling cable, and a seed crystal 124 coupled to the seed holder or chuck 122 for initiating crystal growth.

The growth chamber 100 may also include one or more gas inlets 126 for introducing an inert gas into the growth chamber. The gas inlets 126 may be disposed anywhere along the growth chamber 100. The gas inlets 126 in FIG. 1 are disposed above the melt surface 116. Gas introduced through the gas inlets flows over the surface of the silicon melt and the surface of the growing ingot, thereby preventing contaminant particles from reaching the phase boundary at which the single crystal is growing. Suitable inert gasses include argon, helium, nitrogen, neon, mixtures thereof, and any other suitably inert gas. The inert gas flow over the surface of the silicon melt tends to increase evaporation of species from the silicon melt, particularly volatile dopants, such as indium. This effect is amplified when the inert gas flows through narrow channels above the silicon melt, such as those created by heat shields or reflectors 114. Accordingly, the gas inlets 126 may be attached to one or more flow controllers 128 for controlling the flow rate of the incoming inert gas, described in more detail below.

The growth chamber may also include one or more exhaust outlets 130 for removing fluids, such as inert gases and evaporated species from the melt, and contaminant particles from the growth chamber. The exhaust outlets 130 may be attached to one or more pressure regulating devices 132, described in more detail below, for regulating the internal chamber pressure of the growth chamber 100. The exhaust outlets may also be attached to a pump 134, described in more detail below, which may be operated independently of or in conjunction with the pressure regulating devices 132 to regulate the internal chamber pressure of the growth chamber 100.

In the batch or continuous Czochralski methods, the indium dopant may be introduced as a solid or a liquid. Advantageously, the indium dopant may be introduced as a liquid using a liquid doping system, such as the liquid doping system 200 shown in FIG. 2, to limit the amount of indium dopant evaporation during the doping and/or growth process, and to provide more predictable indium dopant concentrations in the resulting indium-doped silicon ingot.

Figure 2:
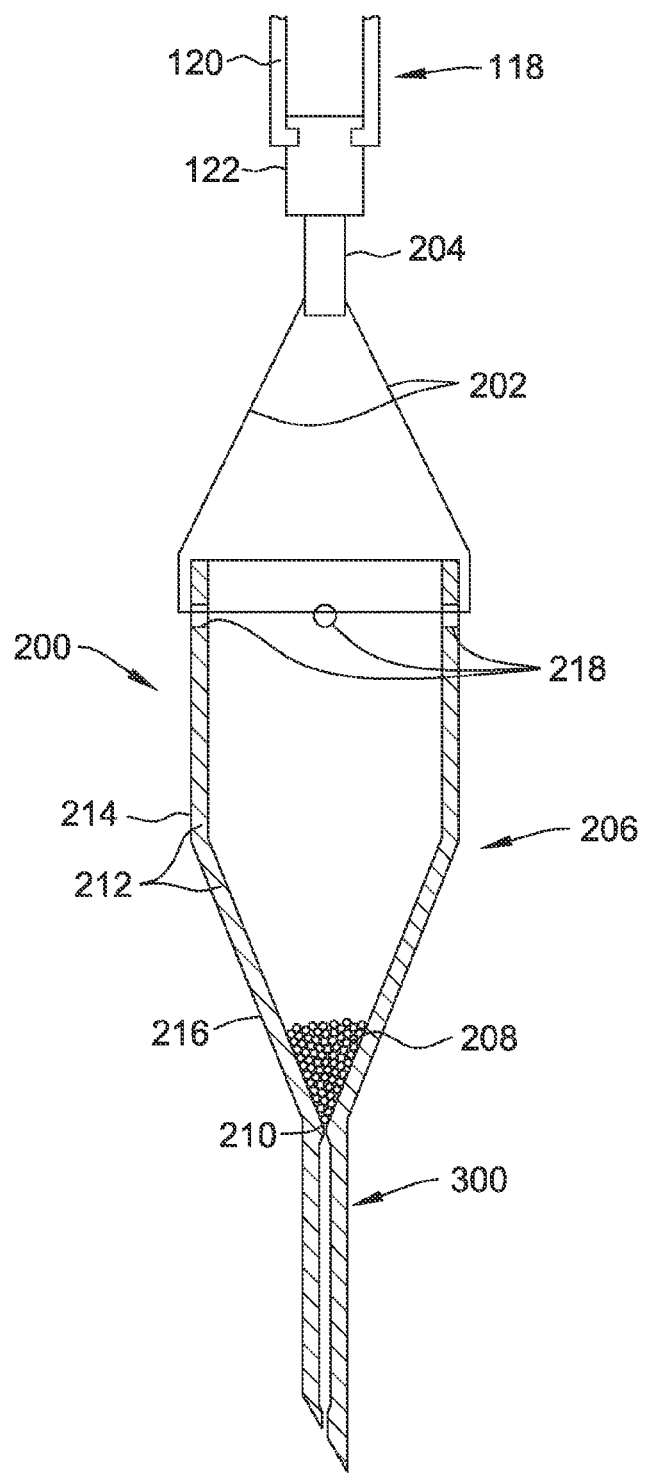
FIG. 2 is a cross-section of a liquid doping system for use in a crystal growth chamber.

The liquid doping system 200 shown in FIG. 2 may be disposed within a growth chamber, such as the growth chamber 100 shown in FIG. 1, and may be suspended by cables or wires 202 from a dummy seed 204 attached to a pulling mechanism, such as the pulling mechanism 118 shown in FIG. 1, for positioning the liquid doping system 200 during the doping process described herein. The dummy seed 204 may be sized and shaped to be received within or coupled to the seed holder or chuck 122 of the pulling mechanism 118 used to grow monocrystalline ingots. In the embodiment shown in FIG. 2, the cables or wires 202 are made from molybdenum or tungsten, although other materials may be used for cables or wires 202. The dummy seed 204 may be made of stainless steel or any other suitable material for supporting the weight of the liquid doping system. When the shape and size of the dummy seed 204 are the same as or similar to the shape and size of the seed crystal 124 used in the pulling mechanism 118 for growing monocrystalline ingots, the liquid doping system 200 can be installed in growth chambers, such as the growth chamber 100 shown in FIG. 1, with little to no modification.

The liquid doping system 200 includes a dopant reservoir 206 for holding dopant 208, and an elongated feeding tube 300 extending from a first, or upper, opening 210 in the dopant reservoir 206. The liquid doping system 200 may be made of any material suitable for high temperature applications (e.g., refractory ceramics, molybdenum, tungsten, and graphite). Quartz is suitable because it minimizes the risk of contamination from the liquid doping system 200. In the embodiment shown in FIG. 2, the liquid doping system 200 has a unitary construction. In other embodiments, the liquid doping system 200 may be assembled from separate components. The dopant reservoir 206 includes quartz sidewalls 212 which define a generally cylindrical body 214 and a tapered end 216 defining the first opening 210 having a smaller cross-sectional area than the cross-sectional area of the body 214. The tapered end 216 has a conical shape to channel dopant to the lowest point of the dopant reservoir 206. In the embodiment shown in FIG. 2, the sidewalls 212 of tapered end 216 are linearly tapered, although the sidewalls 212 defining the tapered end 216 may also be curved inwardly such that tapered end 216 has a bowl-type shape. An end of the body 214 distal from the tapered end 216 includes one or more holes 218, equally spaced around the circumference of body 214, through which cables or wires 202 are inserted to secure the liquid doping system 200 to the pulling mechanism 118 for positioning the liquid doping system 200 during the doping process described herein. The embodiment shown in FIG. 2 has four holes 218, although other embodiments may have a different number of holes.

Figure 3:
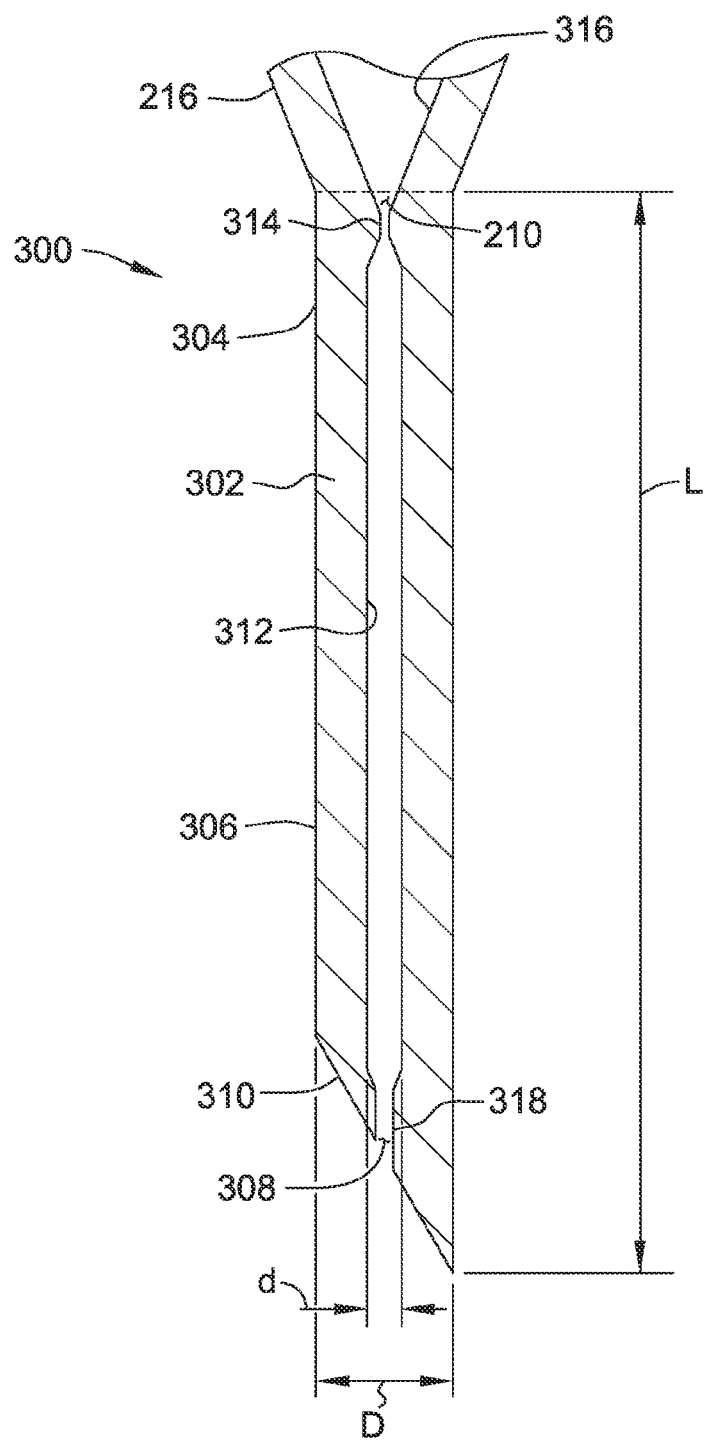
FIG. 3 is an enlarged view of the feeding tube of the doping system shown in FIG. 2.

Referring now to FIG. 3, the feeding tube 300 comprises sidewalls 302 extending from the upper opening 210 to a length L, and has a first, or upper, end 304 positioned near the upper opening 210, and a second, or lower, end 306 distal from the upper end 304, having a second, or lower, opening, 308 defined therein. An angled tip 310 is disposed at the lower end 306 of the feeding tube 300. The angled tip 310 provides a better visual indicator of contact between the lower end 306 of the feeding tube and the melt surface 116, compared to a non-angled tip. The angled tip 310 therefore aids the operator (not shown) in minimizing the contact between the melt 104 and the liquid doping system 200.

As described in more detail below, during the doping process, the doping system is lowered towards the melt surface 116 until the angled tip 310 contacts the melt surface 116. The dopant reservoir 206 is thus positioned above the melt surface 116 by a distance generally equal to the length L of the feeding tube 300. The length L of the feeding tube 300 is selected so that during the doping operation, the dopant reservoir is positioned at a height H (shown in FIG. 5) above the melt surface 116 such that the temperature within the dopant reservoir is just above the melting temperature of the dopant 208, thereby limiting dopant evaporation.

The feeding tube 300 has an inner diameter d defined by inner sidewalls 312 of feeding tube 300, wherein the inner diameter d is sized such that when liquid dopant is passing through the feeding tube 300, the liquid dopant substantially occupies the volume enclosed by feeding tube 300. As a result, the free surface of the liquid dopant is minimized, thereby reducing evaporation of the liquid dopant. The inner diameter d of feeding tube 300 is also sized such that the capillary action does not prevent liquid dopant from passing through feeding tube 300. Because the capillary forces acting on the liquid dopant are inversely related to the temperature of the liquid dopant, the inner diameter d of the feeding tube 300 may be inwardly tapered towards the lower end 306 of the feeding tube 300.

The feeding tube 300 also has an outer diameter D based upon the thickness of the feeding tube sidewalls 302 and the size of the inner diameter d. In the embodiment shown in FIG. 2, the outer diameter D of feeding tube 300 is the same as the outer diameter of the tapered end 216 at the upper opening 210.

The inner sidewalls 312 of the feeding tube 300 extend inwardly near the opening 210 to form a first restriction 314 configured to restrict the passage of solid dopant 208 through the feeding tube 300. The first restriction 314 may alternatively be formed from the inner sidewalls 316 of the tapered end 216, or the first restriction 314 may span the feeding tube 300 and the tapered end 216. The first restriction 314 has a diameter sized to prevent the passage of solid dopant through the feeding tube 300. In the embodiment shown in FIGS. 2 and 3, the first restriction has an inner diameter of 1 mm.

A second restriction 318 of this embodiment is formed near the lower end 306 of the feeding tube 300 to impede the flow of, and reduce the velocity of liquid dopant passing through feeding tube 300. By reducing the velocity of liquid dopant, the impact of the liquid dopant on the melt surface 116 is reduced, thereby reducing splashing or spattering of the melt 104. Further, impeding the flow of the liquid dopant in the lower end 306 of the feeding tube 300 causes the liquid dopant to be further heated prior to being introduced into the melt 104. Thus, the liquid dopant is heated to a temperature approaching the temperature of the melt 104 before being introduced into the melt 104. This reduces the thermal shock between the dopant 208 and the melt 104. Additionally, raising the temperature of the liquid dopant reduces the viscosity of the liquid dopant, thereby further reducing splashing or spattering of the melt 104 when liquid dopant is introduced.

The second restriction 318 also reduces the cross-sectional area of the liquid dopant stream exiting the feeding tube 300, and the resulting free surface area of the liquid dopant on the melt surface 116. By reducing the free surface area of the liquid dopant on the melt surface 116, the second restriction 318 further reduces evaporation of the liquid dopant.

In the embodiment shown in FIG. 3, the second restriction 318 has a similar configuration to the first restriction 314 in that the inner sidewalls 312 of the feeding tube 300 are inwardly tapered near the lower opening 308 to form the second restriction 318. The second restriction 318 extends downwardly to the end of the feeding tube 300, defining the lower opening 308 of the feeding tube 300. The diameter of the second restriction 318 is sized smaller than the inner diameter d of the feeding tube 300, and large enough to permit liquid dopant to overcome the capillary forces acting on the liquid dopant from the inner sidewalls 312 of feeding tube 300. In the embodiment shown in FIG. 3, the diameter of the second restriction is 2 mm.

Figure 4:
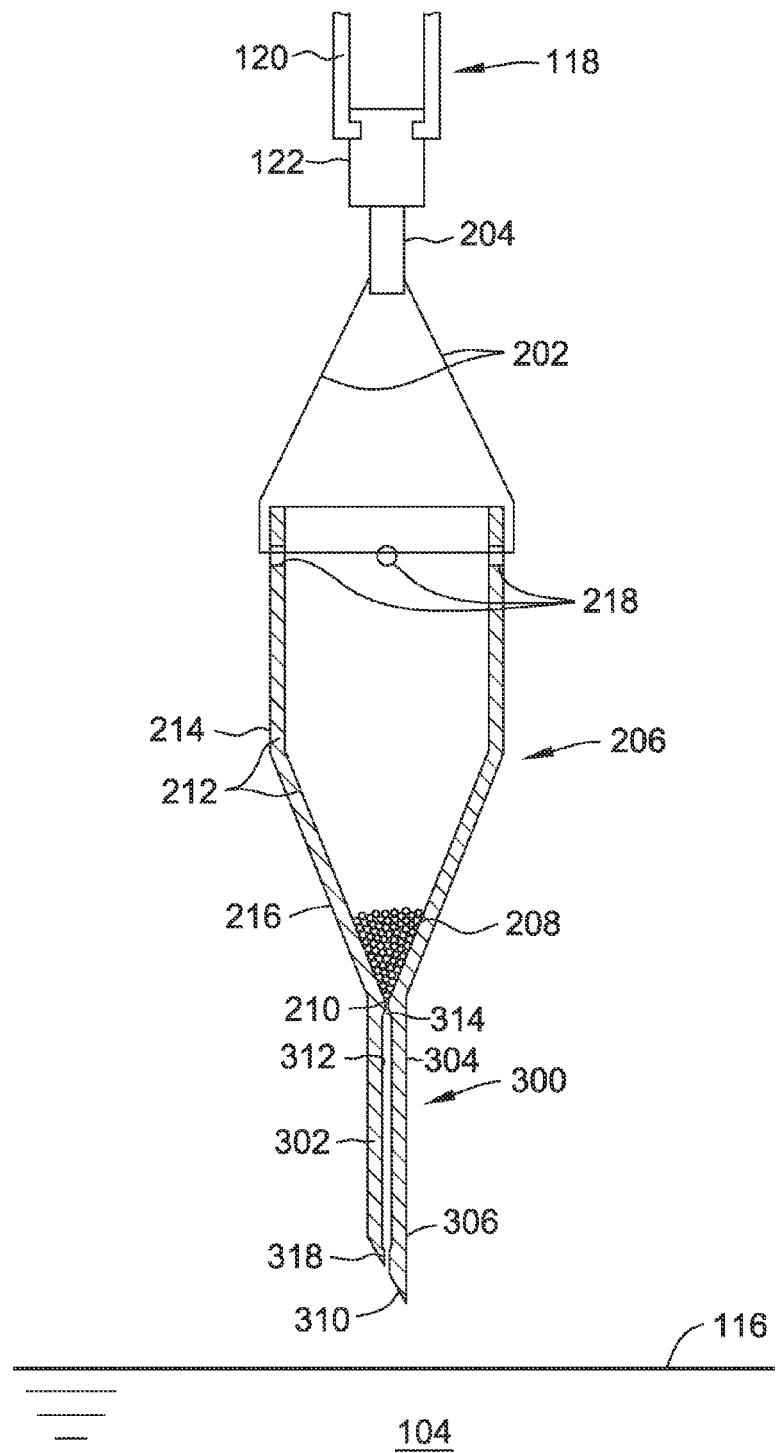
FIG. 4 is a cross-section of the doping system of FIG. 2 being lowered towards a melt surface.
Figure 5:
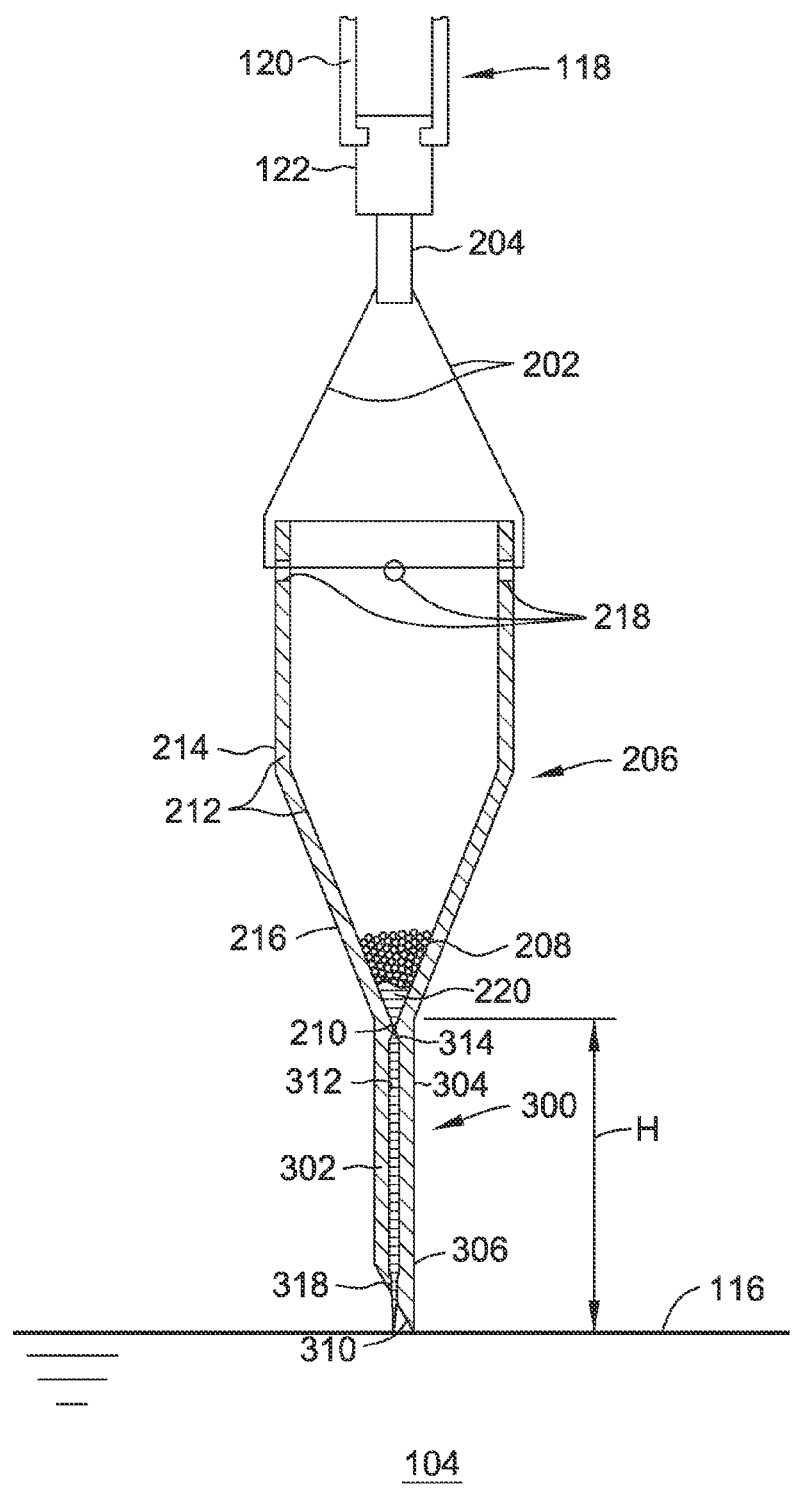
FIG. 5 is a cross-sectional view of the doping system of FIG. 2 positioned near the melt surface

Referring now to FIGS. 2 and 4-5, a method of using the liquid doping system 200 to introduce liquid dopant into a melt of semiconductor or solar-grade material will now be described. As shown in FIG. 2, a predetermined amount of dopant particles 208 are introduced into dopant reservoir 206 while the liquid doping system 200 is positioned remote from the melt surface 116. The tapered end 216 funnels the dopant particles 208 towards the lowest portion of the dopant reservoir 206. The first restriction 314 prevents solid dopant particles 208 from passing through feeding tube 300.

As shown in FIGS. 4-5, to introduce the dopant 208 into the melt 104, the liquid doping system 200 is lowered near the melt surface 116 via pulling mechanism 118. The liquid doping system 200 is lowered until the angled tip 310 of feeding tube 300 contacts the melt surface 116. The angled tip 310 of the feeding tube 300 facilitates positioning of the liquid doping system 200 near the melt surface 116 by providing a better visual indicator of contact between the melt surface 116 and the feeding tube 300. Thus, the liquid doping system 200 is configured to be positioned near the melt surface 116 and to minimize contact with the melt 104, which contact can cause gradual degradation of the doping system from thermal shock and deformation, solidification of the melt material around the feeding tube, and deposition on the feeding tube inner surface of silicon monoxide evaporating from the melt 104.

As the liquid doping system 200 is lowered towards the melt surface 116, the temperature inside the dopant reservoir 206 begins to increase. To reduce the possibility of the dopant 208 melting before it is positioned near the melt surface 116, a move time may be determined within which to position the liquid doping system 200. The move time may be based upon the amount of time needed to melt solid dopant particles 208, and can be estimated by the amount of time needed to raise the temperature of the solid dopant particles 208 to the melting point, or $$t_{move} = \frac{(T_m - T_s) * (c_d * m_d + c_{dd} * m_{dd})}{\frac{dE}{dt}} \qquad \text{Eq. 1}$$

where $T_m$ is the melting temperature of the dopant, $T_s$ is temperature of the solid dopant particles 208 at the beginning of the doping process (normally room temperature), $c_d$ is the specific heat capacity of the solid dopant particles 208, and is the total mass of the solid dopant particles 208, $c_{dd}$ is the specific heat capacity of the liquid doping system 200, $m_{dd}$ is the mass of the liquid doping system 200, and $$\frac{dE}{dt}$$

is the rate of energy transfer from the melt 104 and other components of the growth chamber 100 to the solid dopant particles 208 and to the liquid doping system 200. Positioning the liquid doping system 200 near the melt surface 116 within the move time prevents liquid dopant from being released while liquid doping system 200 is positioned remote from the melt surface 116, thereby preventing a violent impact of the liquid dopant on the melt surface 116.

The angled tip 310 of feeding tube 300 reduces the amount of time needed to position the liquid doping system 200 because it provides a better visual indication of contact between the melt surface 116 and the feeding tube 300. Thus, the angled tip 310 aids the operator (not shown) in positioning the liquid doping system 200 within the move time.

After the liquid doping system 200 is positioned near the melt surface 116, the temperature inside the dopant reservoir 206 is increased to the melting temperature of dopant particles 208. As solid dopant particles 208 liquefy, the resulting liquid dopant 220 flows through first restriction 314 and feeding tube 300. The size of diameter d of feeding tube 300 limits the available free surface of the liquid dopant 220 as it flows through the feeding tube 300, thereby limiting evaporation of the liquid dopant 220.

Liquid dopant 220 flowing through feeding tube 300 is impeded by the second restriction 318 at the lower end 306 of feeding tube 300 before exiting feeding tube 300 through the lower opening 308 and entering the melt 104. The second restriction 318 impedes the flow of, and reduces the velocity of liquid dopant 220 passing through feeding tube 300, thereby reducing the impact of the liquid dopant 220 on the melt surface 116, and any splashing or spattering of the melt 104. Further, impeding the flow of the liquid dopant in the lower end 306 of the feeding tube 300 causes the liquid dopant 220 to be further heated prior to entering the melt 104. As a result, the temperature of the liquid dopant 220 can be heated to a temperature approaching the temperature of the melt 104 before entering the melt, thereby reducing thermal shock between the liquid dopant 220 and the melt 104. Additionally, raising the temperature of the liquid dopant 220 reduces the viscosity of the liquid dopant, thereby further reducing splashing or spattering of the melt 104 when liquid dopant 220 is introduced in to the melt 104.

The second restriction 318 also reduces the cross-sectional area of the liquid dopant 220 stream exiting the feeding tube 300, and the resulting free surface area of the liquid dopant 220 on the melt surface 116. By reducing the free surface area of the liquid dopant 220 on the melt surface 116, the second restriction 318 reduces evaporation of the liquid dopant 220.

Once dopant particles 208 have liquefied and/or a predetermined amount of time has elapsed, liquid doping system 200 is raised by pulling mechanism 118 and removed from furnace 108. The doping process may then be repeated or the liquid doping system 200 may be stored for later use.

If the dopant 208 has a relatively low melting point, e.g., less than 1400° C., or even less than 800° C., the doping method described above can be performed in a relatively short amount of time. As a result, the temperature of the body 214 of dopant reservoir 206 is low enough such that the liquid doping system 200 can be removed from the furnace 108 immediately after the doping process is completed, without the need for a cooling step. Additionally, the dummy seed 204 can be immediately removed from the chuck 122 and replaced with a seed crystal, such as the seed crystal 124 shown in FIG. 1, for use in growing a monocrystalline ingot.

Introducing indium as a liquid, e.g., by using a liquid doping system such as the liquid doping system described herein, reduces indium evaporation during the doping and/or growth process, and provides more predictable indium dopant concentrations in the resulting indium-doped silicon ingot.

Referring now to FIG. 1, during the growth process, an inert gas may be introduced into the growth chamber from one or more gas inlets 126 disposed above the silicon melt 104 to remove contaminants and evaporated species produced by the melt, and reduce the risk of contaminants being incorporated into the grown ingot. The inert gas flows over the melt surface 116 and the surface of the growing ingot 136, thereby preventing contaminant particles from being able to reach the phase boundary 138 at which the single crystal is growing. Suitable inert gasses include argon, helium, nitrogen, neon, mixtures thereof, and any other suitably inert gas.

As discussed above, indium has a relatively high segregation coefficient and high evaporation rate compared to boron. Flowing inert gas over the surface of the silicon melt tends to increase the evaporation rate of indium in the silicon melt, which can result in unpredictable dopant concentrations in the grown ingot. Therefore, the indium dopant concentration in the grown ingot may be controlled by adjusting the inert gas flow rate in relation to other parameters within the growth chamber. In particular, the indium dopant concentration in the grown ingot may be controlled by adjusting the ratio of the inert gas flow rate and the internal chamber pressure based upon a relationship between the inert gas flow rate, the internal chamber pressure, and the effective evaporation rate of indium in the silicon melt.

Specifically, the relationship between the effective evaporation rate of indium in the silicon melt, the inert gas flow rate, and the internal chamber pressure can be expressed as $$g^* = A\left(\frac{f}{p}\right) + B, \qquad \text{Eq. 2}$$

where $g^*$ is the effective evaporation rate of indium in the silicon melt, f is the incoming inert gas flow rate, p is the internal pressure of the chamber, and A and B are each coefficients dependent upon the configuration of the growth chamber. Thus, if A and B are known, the ratio of the inert gas flow rate and the internal pressure of the chamber can be adjusted to obtain a desired effective evaporation rate of indium in the silicon melt. As used herein, "incoming inert gas flow rate" refers to the total flow rate of the inert gas entering the growth chamber through the one or more gas inlets described herein, measured as a volumetric flow rate, a mass flow rate, or any other suitable means of measuring flow rate.

The effective evaporation rate of indium in the silicon melt may be selected based upon a desired indium dopant concentration in the silicon melt at a given time t during the ingot growth process. The indium dopant concentration in the silicon melt may be related to the amount of time elapsed during the growth process by the equation $$C_l = C_{l,0} e^{-\left(\frac{g^*}{H}\right)t}, \qquad \text{Eq. 3}$$

where $C_l$ is the indium dopant concentration in the silicon melt at a given time t during the growth process, $C_{l,0}$ is the initial indium dopant concentration in the silicon melt, $g^*$ is the effective evaporation rate of the indium dopant, and H is the ratio of the melt volume to the free surface of the melt (i.e., the surface area of the silicon melt less the surface area of the ingot cross-section). The effective evaporation rate of indium in the silicon melt may also be selected based upon a desired dopant concentration profile in the grown ingot.

For example, the dopant concentration in a growing ingot at the solid-liquid interface can be approximately calculated using the equation $$C_s = k^* C_l, \qquad \text{Eq. 4}$$

where $C_s$ is the indium dopant concentration in the solidified ingot at the solid-liquid interface, and k is the segregation coefficient of indium in silicon (approximately $4 \times 10^{-4}$). The effective evaporation rate of indium in the silicon melt may also be selected based upon a desired resistivity profile in the grown ingot. For example, the resistivity of indium-doped silicon can be related to the indium dopant concentration in the silicon using industry standards, such as the Irvin curve set forth in DIN 50444, SEMI MF723-0307. For a desired resistivity profile, a corresponding indium-dopant concentration profile may be determined, a corresponding indium-dopant concentration in the silicon melt may be determined, and an effective evaporation rate of indium in the silicon melt may be selected accordingly. In addition to, or as an alternative to using Irvin curves to determine the indium dopant concentration in silicon, one or more calibration ingots may be fabricated and utilized to determine an empirical relationship between the resistivity of indium-doped silicon and the indium dopant concentration of the indium-doped silicon. In such embodiments, the indium dopant concentration may be measured independently of the resistivity using, for example, secondary ion mass spectroscopy (SIMS) or low-temperature Fourier transform infrared spectroscopy (LT-FTIR). Such measurement techniques may provide more accurate values for indium dopant concentration in indium-doped silicon as a result of indium having a relatively high ionization energy in silicon (approximately 160 MeV). The independently measured indium dopant concentrations may be used in combination with measured resistivity values to select an effective evaporation rate of indium in the silicon melt, as described above.

The coefficients A and B in Eq. 2 may be empirically determined based upon measurements taken from grown indium-doped silicon ingots. For example, the coefficients A and B may be determined using the relationship between the effective evaporation rate of indium and the effective segregation coefficient of indium in silicon, $k_e$, expressed as $$g^* = (k_e - k)\frac{Hv}{\delta}, \qquad \text{Eq. 5}$$

where k is the segregation coefficient of indium in silicon (approximately $4 \times 10^4$), H is the ratio of the melt volume to the free surface of the melt, v is the average pull speed of the crystal puller, and $\delta$ is the liquid-to-solid density ratio of silicon. The effective segregation coefficient of indium in silicon, $k_e$, may be calculated from measurements taken from sections cut from grown indium-doped silicon ingots using the equation $$k_e = 1 + \frac{\log\left(\frac{C_a}{C_z}\right)}{\log\left(\frac{1-m_a}{1-m_z}\right)}, \qquad \text{Eq. 6}$$

where $C_a$ is the dopant concentration at the seed end of the ingot section being measured (i.e., the end of the ingot section closest to the seed end of the ingot), $C_z$ is the dopant concentration at the tail end of the ingot section being measured (i.e., the end of the ingot section closest to the tail end of the ingot), $m_a$ is the solidified fraction of the silicon ingot at the seed end of the ingot section, and $m_z$ is the solidified fraction of the silicon ingot at the tail end of the ingot section. As used with reference to Equation 5, for a given cross-section of a silicon ingot taken perpendicular to the longitudinal axis of the ingot, the term "solidified fraction" means the mass of the ingot between the seed end of the ingot and the reference cross-section, divided by the total mass of the initial charge weight used to grow the ingot.

Thus, using the relationships between the inert gas flow rate and the internal chamber pressure described herein, the rate of indium dopant evaporation may be controlled by adjusting the ratio of the inert gas flow rate and the internal chamber pressure. Consequently, the indium-dopant concentration in the grown indium-doped silicon ingot may also be controlled by adjusting the ratio of the inert gas flow rate and the internal chamber pressure. In particular embodiments, the inert gas flow rate and the internal chamber pressure may be adjusted such that the ratio of the inert gas flow rate and the internal chamber pressure is between about 0.05 and about 1.40 normal-liters per minute per millibar, between about 0.10 and about 1.00 normal-liters per minute per millibar, or between about 0.10 and about 0.80 normal-liters per minute per millibar. In yet further embodiments, the flow rate of the inert gas may be varied between about 20 normal-liters per minute and about 200 normal-liters per minute, between about 30 normal-liters per minute and about 140 normal-liters per minute, or between about 30 normal-liters per minute and about 80 normal-liters per minute. In yet further embodiments, the internal pressure of the growth chamber may be varied between about 20 millibar and about 400 millibar, between about 30 millibar and about 200 millibar, or between about 30 millibar and about 100 millibar. As used herein, the term "normal-liter" refers to one liter of the referenced gas at 273.15 Kelvin and 101.325 kPa.

The ratio of the inert gas flow rate and the internal chamber pressure may be adjusted prior to, during, or both prior to and during the growth process to obtain a desired indium dopant concentration in the grown ingot. The inert gas flow rate and/or the internal chamber pressure may be adjusted one more times during the growth process, or even continuously during the growth process. The inert gas flow rate and/or the internal chamber pressure may be adjusted based upon real-time measurements of the Czochralski growth process, or at one or more predetermined times following the start of the growth process. The predetermined times at which the inert gas flow rate or the internal chamber pressure is adjusted may be based upon an amount of time elapsed after commencement of the growth process, upon the ingot reaching a desired length, upon the pulling speed reaching a desired pull speed, or upon an amount of the silicon melt being consumed by the growth process.

The flow rate of the inert gas flowing through the gas inlets 126 is controlled using one or more flow controllers 128 attached to the gas inlets 126. The flow controllers 128 may be any device suitable for regulating the flow rate of inert gas passing through the gas inlet and into the growth chamber, such as mass flow controllers, volumetric flow controllers, throttle valves, or butterfly valves. The flow controllers 128 may be automated or manually controlled. Automated flow controllers may be controlled by one or more programmable devices 140 capable of adjusting the flow rate of the inert gas based on user defined conditions (e.g., after a certain amount of time has elapsed). The flow controllers shown in FIG. 1 are automated mass flow controllers controlled by programmable devices 140 capable of adjusting the flow rate of the inert gas based on user defined conditions.

The internal pressure of the growth chamber 100 may be controlled using one or more pressure regulating devices 132 in fluid communication with the exhaust outlets 130 of the growth chamber. The pressure regulating devices 132 may be any type of device suitable for regulating the pressure within the growth chamber 100, including electronic pressure controllers, throttle valves, butterfly valves, and ball valves. The pressure regulating devices 132 may be automated or manually controlled. Automated pressure regulating devices may be controlled by one or more programmable devices 140 capable of adjusting the internal pressure of the growth chamber 100 based on user defined conditions (e.g., after a certain amount of time has elapsed). The programmable device 140 used to control the pressure regulating device 132 may be separate from or the same as the programmable device 140 used to control the flow controller 128. The pressure regulating device shown in FIG. 1 is automated and controlled by a programmable device 140 capable of adjusting the internal pressure of the growth chamber based on user defined conditions.

A pump 134 in fluid communication with the exhaust outlets 130 of the growth chamber 100 may be used to pump inert gas, contaminants, and evaporated species from the silicon melt (e.g., SiO and dopant related species) out of the growth chamber 100. The pump 134 may be operated independently of or in conjunction with the pressure regulating device 132 to regulate or adjust the pressure within the growth chamber 100. The pump 134 may be controlled by a programmable device 140 capable of adjusting the settings of the pump based on user defined conditions (e.g., after a certain amount of time has elapsed). The programmable device 140 may be the same as or separate from the programmable device used to control the flow controller 128 and/or the pressure regulating device 132.

Adjusting the ratio of the inert gas flow rate and the internal chamber pressure ensures that the relative concentration of indium in the melt remains relatively constant as the indium-doped silicon ingot is grown, and further ensures that the dopant concentration in the indium-doped silicon ingot is relatively uniform.

An advantage of the process of the present disclosure is the preparation of a commercially sized monocrystalline silicon ingot, such as the ingot 600 shown in FIG. 6, with low axial variance of the indium dopant concentration in the direction parallel to the ingot's central axis 602, in addition to the low radial variance along the radius 604 as measured from the central axis to the circumferential edge 606. In some embodiments, the axial variance of the indium concentration may be less than about $5 \times 10^{14}$ atoms per cubic centimeter over an axial length of the monocrystalline silicon ingot of over 20 cm, less than about $1 \times 10^{14}$ atoms per cubic centimeter over an axial length of the monocrystalline silicon ingot of over 20 cm, less than about $5 \times 10^{13}$ atoms per cubic centimeter over an axial length of the monocrystalline silicon ingot of over 20 cm, or even less than about $4 \times 10^{13}$ atoms per cubic centimeter over an axial length of the monocrystalline silicon ingot of over 20 cm. In some embodiments, the axial variance of the indium concentration may be less than about $1 \times 10^{15}$ atoms per cubic centimeter over an axial length of the monocrystalline silicon ingot of over 40 cm, less than about $5 \times 10^{14}$ atoms per cubic centimeter over an axial length of the monocrystalline silicon ingot of over 40 cm, or even less than about $2 \times 10^{14}$ atoms per cubic centimeter over an axial length of the monocrystalline silicon ingot of over 40 cm. In some embodiments, the relative axial variance of indium concentration may be less than about 20% over an axial length of the monocrystalline silicon ingot of over 20 cm, less than about 10% over an axial length of the monocrystalline silicon ingot of over 20 cm, less than about 5% over an axial length of the monocrystalline silicon ingot of over 20 cm, or even less than about 2% over an axial length of the monocrystalline silicon ingot of over 20 cm. In some embodiments, the relative axial variance of indium concentration may be less than about 33% over an axial length of the monocrystalline silicon ingot of over 40 cm, less than about 25% over an axial length of the monocrystalline silicon ingot of over 40 cm, less than about 15% over an axial length of the monocrystalline silicon ingot of over 40 cm, or even less than about 10% over an axial length of the monocrystalline silicon ingot of over 40 cm. In some embodiments, the mass of the indium-doped silicon ingot 600 may be at least about 30 kg, at least about 40 kg, at least about 50 kg, at least about 60 kg, at least about 70 kg, or at least about 80 kg. In yet further embodiments, the mass of the indium-doped silicon ingot 600 may be in excess of 175 kg, such as at least about 180 kg, at least about 200 kg, or even at least about 220 kg. "Relative axial variance" is determined by measuring the change in indium concentration between two points that are located a given distance apart along the axial length of the monocrystalline silicon ingot divided by the indium concentration as measured at the point closest to the seed cone of the monocrystalline silicon ingot. This resultant value is multiplied by 100 in order to arrive at a percentage. This percentage is the "relative axial variance" in indium concentration at disclosed herein. The process of the present disclosure results in a monocrystalline silicon ingot having low relative axial variance of indium concentration over a substantial length of the silicon ingot. Accordingly, the ingot may be sliced into a population of indium-doped monocrystalline silicon wafers having substantially uniform properties of resistivity, conversion efficiency, and resistance to light induced degradation.

The monocrystalline silicon ingot may be processed into a monocrystalline silicon wafer or population of monocrystalline silicon wafers suitable for use in solar cell applications. In this regard, the ingot may be processed according to industry standards, including cutting to have flat edges, grounded, edge chamfered, cropped, and wiresaw cut into a population of monocrystalline silicon wafers having substantially uniform properties of indium concentration and resistivity, as explained herein. The cutting operation generally follows the guidelines provided by the manufacturer of the cutting tool. The monocrystalline silicon ingot is cut into a population of indium-doped monocrystalline silicon wafers having industry standard shapes and sizes meeting the geometric requirements of the end use in a solar cell. An indium-doped monocrystalline silicon wafer processed and sliced according to the industry standard may then be further processed, again according to industry standards, into a solar cell.

In the process of manufacturing a solar cell from an indium-doped monocrystalline silicon wafer, the wafer surface may be textured to minimize reflection. Any "roughening" of the surface reduces reflection by increasing the chances of reflected light bouncing back onto the surface, rather than out to the surrounding air. A single crystalline substrate can be textured by etching along the faces of the crystal planes. The crystalline structure of silicon results in a surface made up of pyramids if the surface is appropriately aligned with respect to the internal atoms. Another type of surface texturing used is known as "inverted pyramid" texturing. Using this texturing scheme, the pyramids are etched down into the silicon surface rather than etched pointing upwards from the surface. The textured wafer is then processed according to industry standards, to contain an emitter according to industry standard process such as diffusion or implantation of phosphorus, followed by edge isolation. In some embodiments, an anti-reflection coating may be applied. Anti-reflection coatings on solar cells are similar to those used on other optical equipment such as camera lenses. They consist of a thin layer of dielectric material, with a thickness so that interference effects in the coating cause the wave reflected from the anti-reflection coating top surface to be out of phase with the wave reflected from the semiconductor surfaces. These out-of-phase reflected waves destructively interfere with one another, resulting in zero net reflected energy. A commonly used coating is silicon nitride. Alternatively, a double layer anti-reflection coating may be applied, such as zinc sulfide/magnesium fluoride. A patterned metal screen, e.g., silver, aluminum, is applied by screen printing to the front and the back of the wafer, which is followed by firing the wafers to yield solar cells useful in, e.g., an array grid.

The solar cells of the present disclosure are characterized by high efficiency of solar spectral irradiance conversion. Solar spectral irradiance conversion efficiency may be measured according to industry standards. For example, conversion efficiency may be measured according to the standard set forth in ASTM G173-03 entitled American Society for Testing and Materials (ASTM) Terrestrial Reference Spectra for Photovoltaic Performance Evaluation. The ASTM G173 spectra represent terrestrial solar spectral irradiance on a surface of specified orientation under a set of specified atmospheric conditions. These distributions of power (watts per square meter per nanometer of bandwidth) as a function of wavelength provide a single common reference for evaluating spectrally selective PV materials with respect to performance measured under varying natural and artificial sources of light with various spectral distributions. The conditions selected were considered to be a reasonable average for the 48 contiguous states of the United States of America (U.S.A.) over a period of one year. The tilt angle selected is approximately the average latitude for the contiguous U.S.A. The receiving surface is defined in the standards as an inclined plane at 37° tilt toward the equator, facing the sun (i.e., the surface normal points to the sun, at an elevation of 41.81° above the horizon). The specified atmospheric conditions are:
  a) the 1976 U.S. Standard Atmosphere with temperature, pressure, aerosol density (rural aerosol loading), air density, molecular species density specified in 33 layers
  b) an absolute air mass of 1.5 (solar zenith angle 48.19°s)
  c) Angstrom turbidity (base e) at 500 nm of 0.084$^c$
  d) total column water vapor equivalent of 1.42 cm
  e) total column ozone equivalent of 0.34 cm
  f) surface spectral albedo (reflectivity) of Light Soil as documented in the Jet Propulsion Laboratory ASTER Spectral Reflectance Database (http://speclib.jpl.nasa.gov.)

The solar cell efficiency is the ratio of the electrical output of a solar cell to the incident energy in the form of sunlight. Terrestrial solar cells are measured under AM1.5 conditions and at a temperature of 25° C. The energy conversion efficiency (η) of a solar cell is the percentage of the solar energy to which the cell is exposed that is converted into electrical energy. The efficiency of a solar cell is determined as the fraction of incident power which is converted to electricity and is defined as:

$$P_{max} = V_{OC} I_{SC} FF \qquad \text{Eq. 7}$$

$$\eta = \frac{V_{OC} I_{SC} FF}{P_{in}} \qquad \text{Eq. 8}$$

where $P_{max}$ is maximum power, $V_{oc}$ is the open-circuit voltage; where $I_{sc}$ is the short-circuit current; where FF is the fill factor; and where η is the efficiency.

The solar cell efficiency is conventionally expressed as a percentage. In some embodiments of the present disclosure, a solar cell comprises an indium-doped monocrystalline silicon wafer characterized by an efficiency of converting solar spectral irradiance on a surface of the indium-doped monocrystalline silicon wafer under an absolute air mass of 1.5 of at least 17%, at least 18%, at least 19%, at least 19.5%, at least 20%, at least 20.5%, at least 21%, at least 22%, at least 24%, at least 26%, at least 28% or at least 30%.

Figure 8A:
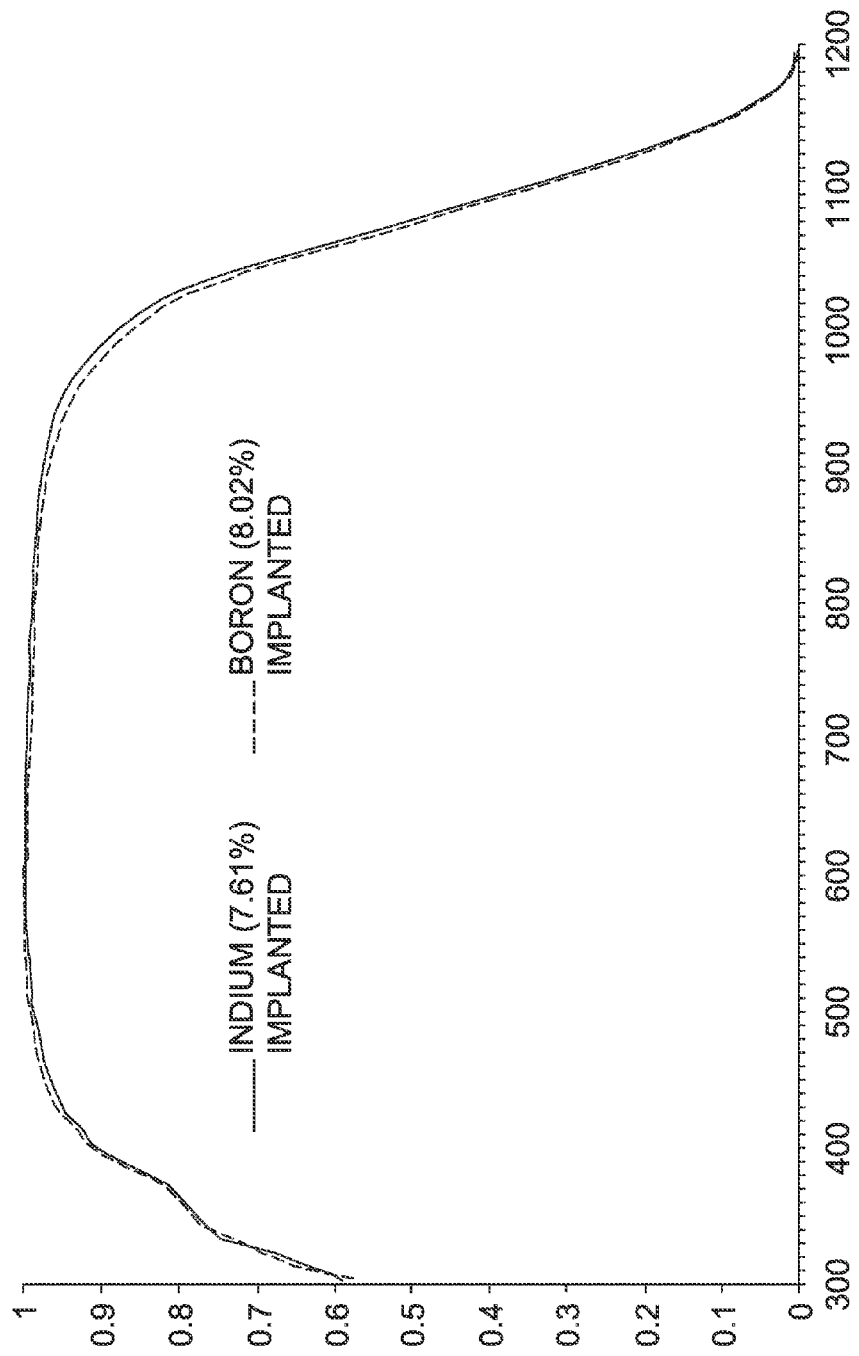
FIGS. 8A, 8B, and 8C are graphs showing the absorption of solar cells fabricated on indium-doped monocrystalline silicon wafers and solar cells fabricated on boron-doped monocrystalline silicon wafers of light across the solar spectrum.
Figure 8B:
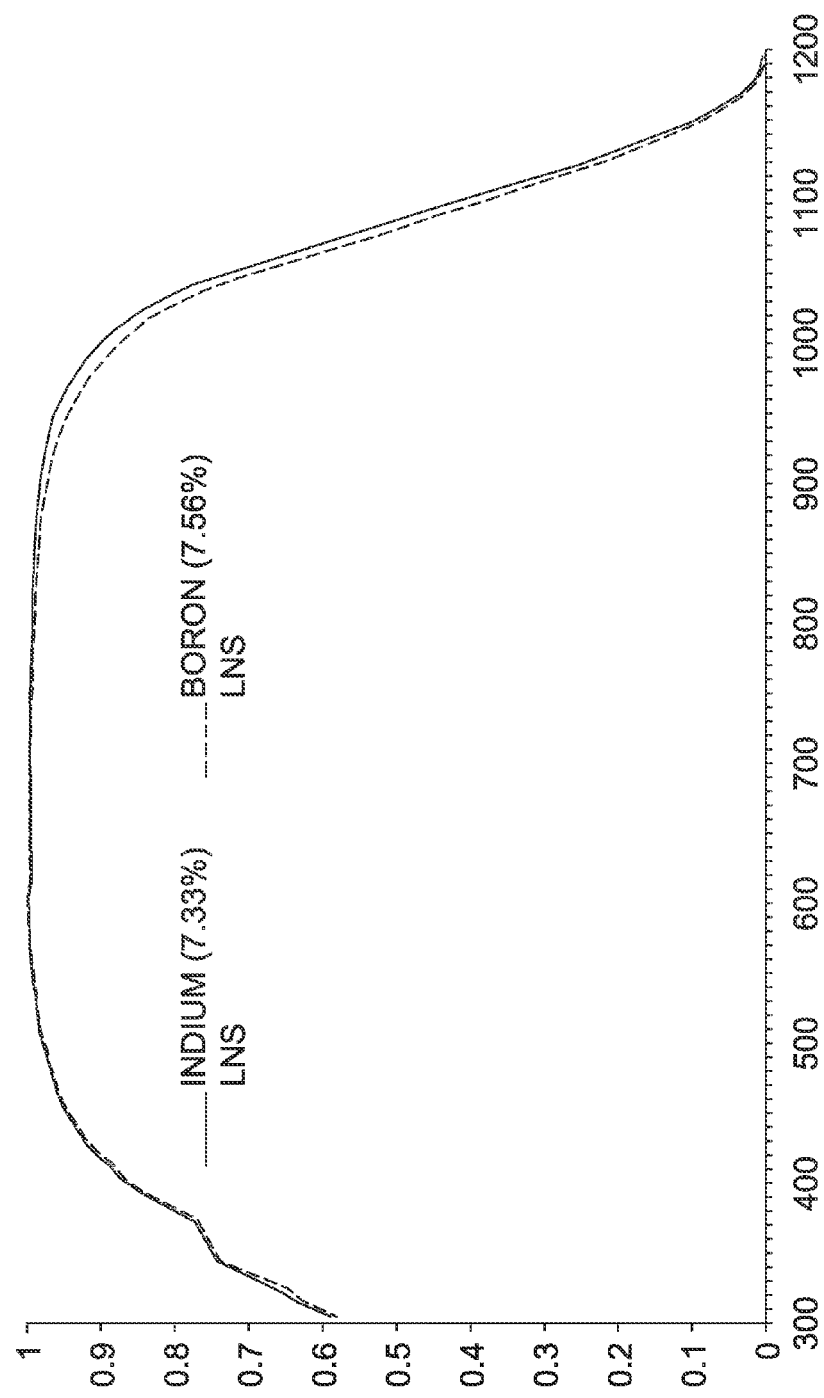
Figure 8C:
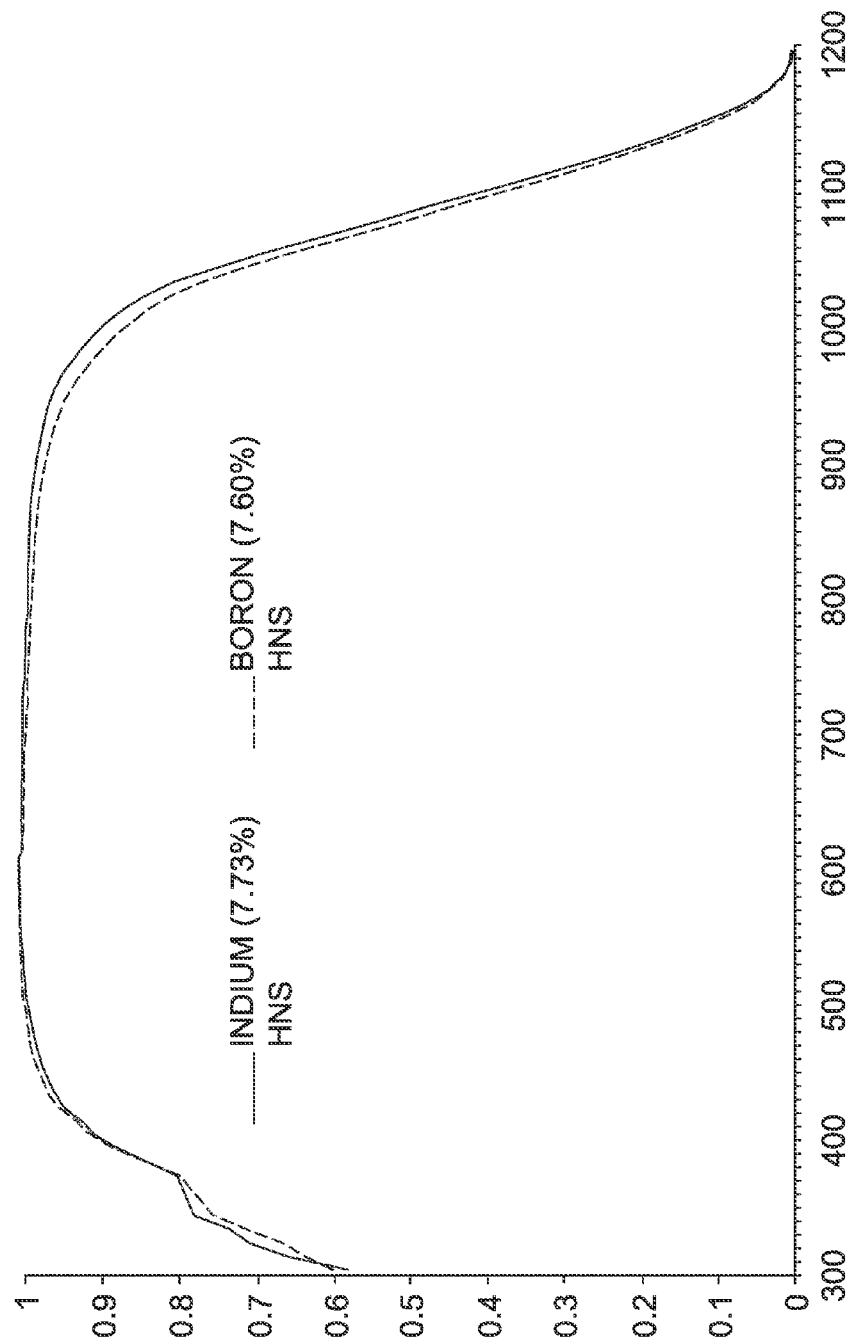

High solar spectral irradiance efficiency is achieved, at least in part, due to the indium-doped monocrystalline silicon wafers capability of absorption and upconverting light in the infrared region of the solar spectrum. Notably, an indium-doped monocrystalline silicon wafer of the present disclosure absorbs more light in the infrared region of the solar spectrum that a boron-doped monocrystalline silicon wafer having substantially similar or identical resistivity. In some embodiments, an indium-doped monocrystalline silicon wafer of the present disclosure absorbs more light in the wavelength range between 830 nm and 1400 nm than a boron-doped wafer having substantially similar or even identical resistivity. See FIGS. 8A, 8B, and 8C, which are graphs showing the better absorption of solar cells fabricated from indium-doped monocrystalline silicon wafers compared to solar cells fabricated from boron-doped monocrystalline silicon wafers of light across the solar spectrum. The absorption of the solar cells fabricated from indium-doped wafers was greater than the absorption of the solar cells fabricated from boron-doped wafers even though the resistivity of the boron-doped wafers (about 2.4 ohm cm) is less than the resistivity of the indium-doped wafers (about 3.5 ohm cm). Based on calculations from a PC1D model (a freely available solar cell modeling program; available from the University of New South Wales), the difference in $J_{SC}$ cannot be accounted for by resistivity. Stated another way, the resistivity of the wafers in the respective solar cells does not explain the increase in absorption of the indium-doped wafers. The higher absorption of lower energy IR light is believed to be due to the higher position in the bandgap of indium dopant atoms compared to boron dopant atoms.

In addition to high efficiency and enhanced upconversion of light across the solar spectrum, the indium-doped monocrystalline silicon wafers of the present disclosure are characterized by low light induced degradation, on both a relative and an absolute basis. In this regard, the relative efficiency of a solar cell comprising an indium-doped monocrystalline silicon wafer degrades by no more than about 2% after 1 hour to 300 hours exposure to light equivalent to 0.1 suns to 10 suns at a temperature less than 45° C. In some embodiments, the relative efficiency of the solar cell degrades by no more than about 1% after 1 hour to 300 hours exposure to light equivalent to 0.1 suns to 10 suns at a temperature less than 45° C. In some embodiments, the relative efficiency of the solar cell degrades by no more than about 0.5% after 1 hour to 300 hours exposure to light equivalent to 0.1 suns to 10 suns at a temperature less than 45° C. In some embodiments, the relative efficiency of the solar cell degrades by no more than about 0.3% after 1 hour to 300 hours exposure to light equivalent to 0.1 suns to 10 suns at a temperature less than 45° C. In some embodiments, the relative efficiency of the solar cell degrades by no more than about 2%, or not more than about 1%, not more than 0.5%, or not more than 0.3%, after 24 hours exposure to light equivalent to 0.7 suns at a temperature less than 45° C. Relative efficiency, as expressed herein, is determined by subjecting the indium-doped monocrystalline silicon wafers to illumination, e.g., 24 hours exposure to light equivalent to 0.7 suns at a temperature less than 45° C., and measuring the decline in efficiency compared to the efficiency of the initial state wafer. The difference in efficiency (efficiency of initial state wafer subtracted by efficiency of wafer after illumination) is divided by the efficiency of initial state wafer. The resultant value may be multiplied by 100 to derive the percentages expressed herein.

The indium-doped monocrystalline silicon wafers are further characterized by low absolute light induced degradation of efficiency. Absolute light induced degradation is determined by subtracting the efficiency of the degraded wafer (expressed as a percentage) from the efficiency of the initial state wafer (also expressed as a percentage). In some embodiments, the absolute efficiency of the solar cell comprising an indium-doped monocrystalline silicon wafer degrades by no more than about 0.5%, or about 0.2%, or about 0.1%, or about 0.06% after 1 hour to 300 hours exposure to light equivalent to 0.1 suns to 10 suns at a temperature less than 45° C. In some embodiments, the absolute efficiency of the solar cell comprising an indium-doped monocrystalline silicon wafer degrades by no more than about 0.5%, about 0.2%, about 0.1%, or about 0.06% after 24 hours exposure to light equivalent to 0.7 suns at a temperature less than 45° C. In some embodiments, the absolute efficiency of the solar cell comprising an indium-doped monocrystalline silicon wafer degrades by no more than about 1.0%, about 0.5%, about 0.2%, about 0.1%, or about 0.06% after 4 hours exposure to sunlight at a temperature less than 45° C.

Having described the disclosure in detail, it will be apparent that modifications and variations are possible without departing from the scope of the invention defined in the appended claims.

EXAMPLES

The following examples are non-limiting.

Example 1. Indium-Doped Monocrystalline Silicon Ingot Grown by Batch Czochralski Method An indium-doped monocrystalline silicon ingot was grown by a conventional batch Czochralski method. The ingot was grown to a diameter greater than 200 mm and then ground by a method standard in the industry to a uniform diameter of 200 mm.

The ingot was sliced by wiresaw into wafers having a thickness between about 180 micrometers and about 200 micrometers, and wafers were selected for analysis from various lengths from the seed cone. The wafers were tested for resistivity at the center of the wafer and at 6 mm from the edge of the wafer, indium concentration at the center of the wafer, oxygen concentration at the center of the wafer, carbon concentration at the center of the wafer, and radial resistivity variance. The indium concentration was determined using the Irvin curve set forth in DIN 50444, SEMI MF723-0307. These data are provided in the following Table 1.

TABLE 1

| Section (distance from seed cone) cm | Resistivity at wafer center Ohm-cm | [In] Atoms/cm$^3$ | [O] PPMA | [C] PPMA | Radial Resistivity Variance % |
|---|---|---|---|---|---|
| 0 | 16.50 | $8.10 \times 10^{14}$ | 17.65 | 0.011 | 8.3 |
| 23 | 15.76 | $8.48 \times 10^{14}$ | 17.60 | 0.001 | 10.6 |
| 45 | 16.15 | $8.27 \times 10^{14}$ | 17.21 | 0.027 | 8.5 |
| 65 | 16.95 | $7.88 \times 10^{14}$ | 17.34 | 0.034 | 9.7 |
| 91 | 17.73 | $7.53 \times 10^{14}$ | 15.23 | 0.077 | 6.5 |

Example 2. Indium-Doped Monocrystalline Silicon Ingot Grown by Batch Czochralski Method An indium-doped monocrystalline silicon ingot was grown by batch Czochralski method. During the growth process, the ratio of the inert gas flow rate and the internal chamber pressure were adjusted to control the indium dopant concentration in the grown ingot according to the methods described herein. The ingot was grown to a diameter greater than 200 mm and then ground by a method standard in the industry to a uniform diameter of 200 mm.

The ingot was sliced by wiresaw into wafers having a thickness between about 180 micrometers and about 200 micrometers, and wafers were selected for analysis from various lengths from the seed cone. The wafers were tested for resistivity at the center of the wafer and at 6 mm from the edge of the wafer, indium concentration at the center of the wafer, oxygen concentration at the center of the wafer, carbon concentration at the center of the wafer, and radial resistivity variance. The indium concentration was determined using the Irvin curve set forth in DIN 50444, SEMI MF723-0307. These data are provided in the following Table 2.

TABLE 2

| Section (distance from seed cone) cm | Resistivity at wafer center Ohm-cm | [In] Atoms/cm$^3$ | [O] PPMA | [C] PPMA | Radial Resistivity Variance % |
|---|---|---|---|---|---|
| 0 | 5.43 | $2.49 \times 10^{15}$ | 16.57 | 0.001 | 10.1 |
| 23 | 5.07 | $2.67 \times 10^{15}$ | 16.46 | 0.004 | 12.0 |
| 45 | 4.99 | $2.71 \times 10^{15}$ | 15.93 | 0.026 | 8.6 |
| 60 | 4.76 | $2.88 \times 10^{15}$ | 15.94 | 0.034 | 6.8 |
| 91 | 3.04 | $4.50 \times 10^{15}$ | 13.23 | 0.131 | 6.5 |

Example 3. Indium-Doped Monocrystalline Silicon Ingot Grown by Batch Czochralski Method An indium-doped monocrystalline silicon ingot was grown by batch Czochralski method. During the growth process, the ratio of the inert gas flow rate and the internal chamber pressure were adjusted to control the indium dopant concentration in the grown ingot according to the methods described herein. The ingot was grown to a diameter greater than 200 mm and then ground by a standard method to a uniform diameter of 200 mm.

The ingot was sliced by wiresaw into wafers having a thickness between about 180 micrometers and about 200 micrometers, and wafers were selected for analysis from various lengths from the seed cone. The wafers were tested for resistivity at the center of the wafer and at 6 mm from the edge of the wafer, indium concentration at the center of the wafer, oxygen concentration at the center of the wafer, carbon concentration at the center of the wafer, and radial resistivity variance. The indium concentration was determined using the Irvin curve set forth in DIN 50444, SEMI MF723-0307. These data are provided in the following Table 3.

TABLE 3

| Section (distance from seed cone) cm | Resistivity at wafer center Ohm-cm | [In] Atoms/cm$^3$ | [O] PPMA | [C] PPMA | Radial Resistivity Variance % |
|---|---|---|---|---|---|
| 2 | 4.18 | 3.23 × 10$^{15}$ | 16.38 | 0.058 | 8.7 |
| 22 | 3.94 | 3.45 × 10$^{15}$ | 15.84 | 0.088 | 13.4 |
| 44 | 3.52 | 3.87 × 10$^{15}$ | 15.40 | 0.111 | 6.9 |
| 67 | 3.03 | 4.52 × 10$^{15}$ | 14.91 | 0.15 | 4.1 |
| 78 | 2.60 | 5.29 × 10$^{15}$ | 14.51 | 0.166 | 5.6 |
| 90 | 1.90 | 7.34 × 10$^{15}$ | 11.14 | 0.368 | 0.04 |

Example 4. Indium-Doped Monocrystalline Silicon Ingot Grown by Batch Czochralski Method An indium-doped monocrystalline silicon ingot was grown by batch Czochralski method. During the growth process, the ratio of the inert gas flow rate and the internal chamber pressure were adjusted to control the indium dopant concentration in the grown ingot according to the methods described herein. The ingot was grown to a diameter greater than 200 mm and then ground by a standard method to a uniform diameter of 200 mm.

The ingot was sliced by wiresaw into wafers having a thickness between about 180 micrometers and about 200 micrometers, and wafers were selected for analysis from various lengths from the seed cone. The wafers were tested for resistivity at the center of the wafer and at 6 mm from the edge of the wafer, indium concentration at the center of the wafer, oxygen concentration at the center of the wafer, carbon concentration at the center of the wafer, and radial resistivity variance. The indium concentration was determined using the Irvin curve set forth in DIN 50444, SEMI MF723-0307. These data are provided in the following Table 4.

TABLE 4

| Section (distance from seed cone) cm | Resistivity at wafer center Ohm-cm | [In] Atoms/cm$^3$ | [O] PPMA | [C] PPMA | Radial Resistivity Variance % |
|---|---|---|---|---|---|
| 0 | 2.34 | 5.90 × 10$^{15}$ | 14.1 | 0.069 | 7.0 |
| 30 | 2.05 | 6.76 × 10$^{15}$ | 11.5 | 0.058 | 10.3 |
| 60 | 1.71 | 8.19 × 10$^{15}$ | 10.0 | 0.093 | 8.0 |
| 85 | 1.21 | 1.18 × 10$^{16}$ | 9.2 | 0.202 | 4.4 |

For comparison, the indium dopant concentration of each wafer was also measured independently from the resistivity using SIMS and LT-FTIR. These data are provided in the following Table 5.

TABLE 5

| Section (distance from seed cone) cm | Resistivity at wafer center Ohm-cm | [In] Resistivity Atoms/cm$^3$ | [In] SIMS Atoms/cm$^3$ | [In] LT-FTIR Atoms/cm$^3$ |
|---|---|---|---|---|
| 0 | 2.34 | 5.90 × 10$^{15}$ | 8.05 × 10$^{15}$ | 7.10 × 10$^{15}$ |
| 30 | 2.05 | 6.76 × 10$^{15}$ | 9.50 × 10$^{15}$ | 8.20 × 10$^{15}$ |
| 60 | 1.71 | 8.19 × 10$^{15}$ | 1.30 × 10$^{16}$ | 1.20 × 10$^{16}$ |
| 85 | 1.21 | 1.18 × 10$^{16}$ | 2.30 × 10$^{16}$ | 1.90 × 10$^{16}$ |

Example 5. Wafers Taken from Indium-Doped Monocrystalline Silicon Ingot Grown by Batch Czochralski Method 200 wafers were selected from the Ingot grown according to the method described in Example 3. The wafers had flat to flat lengths of the major dimensions of 156 mm+/−0.5 mm. The wafer diagonal dimension was 200 mm+/−0.5 mm. The corner length was 15.4 mm+1-1 mm. The thicknesses of the wafers were 200 micrometers+/−20 micrometers or 180 micrometers+/−20 micrometers.

The resistivity of the 200 wafers was within the range of 3.03 ohm-cm to 3.5 ohm-cm. The oxygen concentrations of the wafers were within the range of 14.9 PPMA to 15.4 PPMA. The lifetimes of the wafers were within the range of 325 microseconds to 651 microseconds (measured at crystal level at injection level of 5×10$^{14}$/cm$^3$; Sinton BCT 400).

Example 6. Initial State Testing of Indium-Doped Monocrystalline Silicon Wafers Implanted with 90 Ohm/Sq Emitter Solar cells were fabricated from the indium-doped wafers prepared according to the method described in Example 5. The wafers were selected to have resistivity of 3.5 ohm-cm and were implanted with a 90 ohm/sq emitter.

The solar cells were measured to determine their initial state characteristics. The results are displayed in the following Table 6.

TABLE 6

| ID | $V_{OC}$ (mV) | $J_{SC}$ (mA/cm$^2$) | FF | Efficiency | N-factor | $R_S$ | $R_{SH}$ |
|---|---|---|---|---|---|---|---|
| 1 | 0.638 | 38.2 | 78.8 | 19.2 | 1.05 | 0.635 | 4280 |
| 2 | 0.638 | 38.0 | 79.1 | 19.2 | 1.05 | 0.585 | 4810 |
| 3 | 0.638 | 38.0 | 78.8 | 19.1 | 1.07 | 0.644 | 4670 |
| 4 | 0.636 | 37.9 | 78.9 | 19.0 | 1.07 | 0.631 | 5340 |
| 5 | 0.636 | 38.0 | 78.7 | 19.0 | 1.07 | 0.650 | 7246 |
| Average | 0.637 | 38.0 | 78.9 | 19.2 | 1.06 | 0.629 | 5269 |

The table of this example and the following examples provide several performance characteristics for comparing solar cells. $V_{OC}$ denotes the open-circuit voltage, i.e., the maximum voltage available from the solar cell. FF denotes fill factor, which is the maximum power from a solar cell, defined as the ratio of the maximum power from the solar cell to the product of $V_{OC}$ and $I_{SC}$ (the short circuit current). Efficiency is defined as the ratio of energy output from the solar cell to input energy from the sun. N-factor denotes the diode ideality factor, which may range from 1 to 2. A value closer to 1 denotes ideal behavior. $R_S$ denotes the series resistance. $R_{SH}$ denotes shunt resistance.

Example 7. Initial State Testing of Indium-Doped Monocrystalline Silicon Wafers Diffused with POCL3-HNS 65 ohm/sq Solar cells were fabricated from the indium-doped wafers prepared according to the method described in Example 5.

The wafers were selected to have resistivity of 3.5 ohm-cm and were diffused with a POCL3-HNS 65 emitter.

The solar cells were measured to determine their initial state characteristics. The results are displayed in the following Table 7.

TABLE 7

| ID | $V_{OC}$ (mV) | $J_{SC}$ (mA/cm$^2$) | FF | Efficiency | N-factor | $R_S$ | $R_{SH}$ |
|---|---|---|---|---|---|---|---|
| 1 | 0.628 | 37.2 | 79.3 | 18.5 | 1.00 | 0.659 | 5350 |
| 2 | 0.629 | 37.2 | 78.9 | 18.5 | 1.06 | 0.611 | 1140 |
| 3 | 0.629 | 37.2 | 78.1 | 18.3 | 1.05 | 0.791 | 1340 |
| 4 | 0.629 | 37.2 | 79.5 | 18.6 | 1.02 | 0.560 | 2120 |
| 5 | 0.629 | 37.4 | 79.0 | 18.6 | 1.05 | 0.594 | 1390 |
| Average | 0.629 | 37.3 | 79.0 | 18.5 | 1.04 | 0.643 | 2268 |

Comparative Example 1. Boron-Doped Monocrystalline Silicon Ingot Grown by Continuous Czochralski Method 200 wafers were selected from a boron-doped ingot grown according to the continuous Czochralski method. The wafers had flat to flat lengths of the major dimensions of 156 mm+/−0.5 mm. The wafer diagonal dimension was 200 mm+/−0.5 mm. The corner length was 15.4 mm+/−1 mm. The thicknesses of the wafers were 200 micrometers+/−20 micrometers or 180 micrometers+/−20 micrometers.

The resistivity of the 200 boron-doped wafers was between about 2.4 ohm-cm and about 2.73 ohm-cm. The oxygen concentrations of the wafers were about 14.6 PPMA. The lifetimes of the wafers were about 320 microseconds (measured at crystal level at injection level of $5 \times 10^{14}$/cm$^3$; Sinton BCT 400).

Comparative Example 2. Initial State Testing of Boron-Doped Monocrystalline Silicon Wafers Implanted with 90 ohm/sq Emitter Solar cells were fabricated from the boron-doped wafers prepared according to the method described in Comparative Example 1. The wafers were selected to have resistivity of 2.4 ohm-cm and were implanted with a 90 ohm/sq emitter.

The solar cells were measured to determine their initial state characteristics. The results are displayed in the following Table 8.

TABLE 8

| ID | $V_{OC}$ (mV) | $J_{SC}$ (mA/cm$^2$) | FF | Efficiency | N-factor | $R_S$ | $R_{SH}$ |
|---|---|---|---|---|---|---|---|
| 1 | 0.642 | 37.8 | 78.9 | 19.1 | 1.10 | 0.524 | 3060 |
| 2 | 0.642 | 37.7 | 79.1 | 19.2 | 1.08 | 0.552 | 4500 |
| 3 | 0.641 | 37.5 | 78.7 | 18.9 | 1.11 | 0.566 | 5690 |
| 4 | 0.634 | 37.4 | 77.9 | 18.5 | 1.18 | 0.585 | 5340 |
| 5 | 0.641 | 37.6 | 79.0 | 19.0 | 1.11 | 0.479 | 4867 |
| Average | 0.640 | 37.6 | 78.7 | 18.9 | 1.12 | 0.541 | 4691 |

Comparative Example 3. Initial State Testing of Boron-Doped Monocrystalline Silicon Wafers Diffused with POCL3-HNS 65 ohm/sq Solar cells were fabricated from the boron-doped wafers prepared according to the method described in Comparative Example 1. The wafers were selected to have resistivity of 2.4 ohm-cm and were implanted with a POCL3-HNS 65 emitter.

The solar cells were measured to determine their initial state characteristics. The results are displayed in the following Table 9.

TABLE 9

| ID | $V_{OC}$ (mV) | $J_{SC}$ (mA/cm$^2$) | FF | Efficiency | N-factor | $R_S$ | $R_{SH}$ |
|---|---|---|---|---|---|---|---|
| 1 | 0.632 | 36.9 | 79.5 | 18.6 | 1.03 | 0.579 | 6910 |
| 2 | 0.632 | 37.1 | 79.1 | 18.6 | 1.03 | 0.613 | 6470 |
| 3 | 0.633 | 37.0 | 79.5 | 18.6 | 1.04 | 0.633 | 7140 |
| 4 | 0.633 | 37.0 | 79.8 | 18.7 | 1.02 | 0.574 | 7420 |
| 5 | 0.632 | 37.1 | 78.8 | 18.5 | 1.05 | 0.659 | 5480 |
| Average | 0.633 | 37.0 | 79.3 | 18.6 | 1.03 | 0.612 | 6684 |

Example 8. Light Induced Degradation Testing of Solar Cells Fabricated from Indium-Doped Monocrystalline Silicon Wafers and Solar Cells Fabricated from Boron-Doped Monocrystalline Silicon Wafers Solar cells fabricated from indium-doped monocrystalline silicon wafers of Example 6 and solar cells fabricated from boron-doped monocrystalline silicon wafers of Comparative Example 2 were subjected to solar spectral irradiance equivalent to 0.7 suns for 24 hours at a temperature below 45° C. in order to test the light induced degradation of various performance characteristics of the solar cells. The performance characteristics of the initial solar cells and the performance characteristics of the solar cells after irradiance for 24 hours are presented in the following Table 10.

TABLE 10

| Dopant | Wafer ID | Initial $V_{OC}$ (mV) | $V_{OC}$ LID (mV) | Initial FF | FF LID | Initial $J_{SC}$ (mA/cm$^2$) | $J_{SC}$ LID (mA/cm$^2$) |
|---|---|---|---|---|---|---|---|
| Indium | 1 | 0.638 | 0.636 | 79.1 | 78.9 | 38.0 | 38.1 |
|  | 2 | 0.638 | 0.637 | 78.8 | 78.5 | 38.0 | 38.0 |
| Boron | 1 | 0.642 | 0.635 | 79.1 | 78.2 | 37.7 | 37.4 |
|  | 2 | 0.641 | 0.643 | 79.0 | 77.8 | 37.6 | 37.3 |

| Dopant | Wafer ID | Initial Efficiency | Efficiency LID | Change in Efficiency | Initial n-factor | n-factor LID |
|---|---|---|---|---|---|---|
| Indium | 1 | 19.2 | 19.1 | −0.06 | 1.05 | 1.08 |
|  | 2 | 19.1 | 19.0 | −0.10 | 1.07 | 1.09 |
| Boron | 1 | 19.2 | 18.6 | −0.56 | 1.08 | 1.19 |
|  | 2 | 19.0 | 18.4 | −0.59 | 1.11 | 1.21 |

The light induced degradation evaluations were performed on solar cells fabricated from indium-doped monocrystalline silicon wafers and solar cells fabricated from boron-doped monocrystalline silicon wafers that were selected to be closely matched in oxygen concentration and dopant concentration. The solar cells fabricated from indium-doped wafers showed substantially reduced light induced degradation after illumination compared to the solar cells fabricated from boron-doped wafers. More specifically, the efficiency of the solar cells fabricated from indium-doped wafers remained above 19% after illumination, and the relative degradation was only about 0.4% (absolute degradation of 0.08%) for the indium-doped cells, compared to relative degradation of about 3% (absolute degradation of about 0.6%) for the boron-doped cells. In view of these results, solar cells fabricated from indium-doped cells exhibited substantially less light induced degradation than solar cells fabricated from boron-doped cells.

Example 9. Initial State Testing of Indium-Doped Monocrystalline Silicon Wafers Implanted with 90-110 ohm/sq Emitter Solar cells were fabricated from indium-doped wafers. The wafers were selected to have resistivity of 3.4 ohm-cm and were implanted with a 90-110 ohm/sq emitter.

The solar cells were measured to determine their initial state characteristics. The results are displayed in the following Table 11.

TABLE 11

| ID | $V_{OC}$ (mV) | $J_{SC}$ (mA/cm$^2$) | FF | Efficiency | N-factor | $R_S$ | $R_{SH}$ |
|---|---|---|---|---|---|---|---|
| 1 | 0.638 | 37.9 | 79.0 | 19.1 | 1.08 | 0.58 | 4453 |
| 2 | 0.638 | 37.7 | 79.0 | 19.0 | 1.08 | 0.56 | 3002 |
| 3 | 0.638 | 37.7 | 79.0 | 19.0 | 1.08 | 0.55 | 4150 |
| 4 | 0.637 | 37.7 | 79.0 | 19.0 | 1.10 | 0.55 | 2310 |
| Max | 0.638 | 37.9 | 79.0 | 19.1 | 1.08 | 0.58 | 4453 |
| Average | 0.638 | 37.7 | 79.0 | 19.0 | 1.09 | 0.56 | 3479 |

Example 10. Initial State Testing of Indium-Doped Monocrystalline Silicon Wafers Implanted with 90-110 ohm/sq Emitter Solar cells were fabricated from indium-doped wafers. The wafers were selected to have resistivity of 3.1 ohm-cm and were implanted with a 90-110 ohm/sq emitter.

The solar cells were measured to determine their initial state characteristics. The results are displayed in the following Table 12.

TABLE 12

| ID | $V_{OC}$ (mV) | $J_{SC}$ (mA/cm$^2$) | FF | Efficiency | N-factor | $R_S$ | $R_{SH}$ |
|---|---|---|---|---|---|---|---|
| 1 | 0.637 | 37.9 | 79.2 | 19.1 | 1.09 | 0.50 | 5730 |
| 2 | 0.637 | 37.9 | 79.1 | 19.1 | 1.08 | 0.54 | 4316 |
| 3 | 0.638 | 37.7 | 79.0 | 19.0 | 1.08 | 0.55 | 5170 |
| 4 | 0.638 | 37.7 | 79.0 | 19.0 | 1.11 | 0.50 | 3810 |
| 5 | 0.638 | 37.8 | 78.8 | 19.0 | 1.12 | 0.52 | 2712 |
| Max | 0.637 | 37.9 | 79.2 | 19.1 | 1.09 | 0.50 | 5730 |
| Average | 0.638 | 37.8 | 79.0 | 19.0 | 1.10 | 0.52 | 4348 |

Comparative Example 4. Initial State Testing of Boron-Doped Monocrystalline Silicon Wafers Implanted with 90-110 ohm/sq Emitter Solar cells were fabricated from boron-doped wafers. The wafers were selected to have resistivity of 2.6 ohm-cm and were implanted with a 90-110 ohm/sq emitter.

The solar cells were measured to determine their initial state characteristics. The results are displayed in the following Table 13.

TABLE 13

| ID | $V_{OC}$ (mV) | $J_{SC}$ (mA/cm$^2$) | FF | Efficiency | N-factor | $R_S$ | $R_{SH}$ |
|---|---|---|---|---|---|---|---|
| 1 | 0.643 | 37.6 | 78.1 | 18.9 | 1.10 | 0.73 | 8628 |
| 2 | 0.641 | 37.5 | 78.7 | 18.9 | 1.12 | 0.58 | 4261 |
| 3 | 0.642 | 37.4 | 78.5 | 18.8 | 1.13 | 0.61 | 6310 |
| 4 | 0.642 | 37.5 | 78.6 | 18.9 | 1.12 | 0.59 | 6010 |
| 5 | 0.642 | 37.6 | 78.2 | 18.9 | 1.15 | 0.61 | 2930 |
| Max | 0.643 | 37.6 | 78.1 | 18.9 | 1.10 | 0.73 | 8628 |
| Average | 0.642 | 37.5 | 78.4 | 18.9 | 1.12 | 0.62 | 5628 |

Comparative Example 5. Initial State Testing of Boron-Doped Monocrystalline Silicon Wafers Implanted with 90-110 ohm/sq Emitter Solar cells were fabricated from boron-doped wafers. The wafers were selected to have resistivity of 2.5 ohm-cm and were implanted with a 90-110 ohm/sq emitter.

The solar cells were measured to determine their initial state characteristics. The results are displayed in the following Table 14.

TABLE 14

| ID | $V_{OC}$ (mV) | $J_{SC}$ (mA/cm$^2$) | FF | Efficiency | N-factor | $R_S$ | $R_{SH}$ |
|---|---|---|---|---|---|---|---|
| 1 | 0.642 | 37.5 | 79.2 | 19.1 | 1.12 | 0.48 | 2457 |
| 2 | 0.643 | 37.4 | 78.9 | 19.0 | 1.11 | 0.53 | 3847 |
| Max | 0.642 | 37.5 | 79.2 | 19.1 | 1.12 | 0.48 | 2457 |
| Average | 0.643 | 37.4 | 79.0 | 19.0 | 1.12 | 0.51 | 3152 |

Example 11. Light Induced Degradation Testing of Solar Cells Fabricated from Indium-Doped Monocrystalline Silicon Wafers and Solar Cells Fabricated from Boron-Doped Monocrystalline Silicon Wafers Solar cells fabricated from indium-doped monocrystalline silicon wafers of Example 9 and Example 10 and solar cells fabricated from boron-doped monocrystalline silicon wafers of Comparative Example 4 and Comparative Example 5 were subjected to solar spectral irradiance equivalent to 0.7 suns for 24 hours at a temperature below 45° C. in order to test the light induced degradation of various performance characteristics of the solar cells. The average performance characteristics of the initial solar cells and the performance characteristics of the solar cells after irradiance for 24 hours are presented in the following Table 15.

TABLE 15

| Dopant | Wafer ID | Initial $V_{OC}$ (mV) | $V_{OC}$ LID (mV) | Initial FF | FF LID | Initial $J_{SC}$ (mA/cm$^2$) | $J_{SC}$ LID (mA/cm$^2$) |
|---|---|---|---|---|---|---|---|
| Indium | Ex. 8 | 0.637 | 0.637 | 79.0 | 78.8 | 37.7 | 37.9 |
| | Ex. 9 | 0.638 | 0.636 | 78.8 | 78.7 | 37.8 | 37.9 |
| Boron | C. Ex 4 | 0.643 | 0.635 | 78.1 | 77.8 | 37.6 | 37.2 |
| | C. Ex5 | 0.643 | 0.635 | 78.9 | 78.1 | 37.4 | 37.2 |

| Dopant | Wafer ID | Initial Efficiency | Efficiency LID | Change in Efficiency | Initial n-factor | n-factor LID |
|---|---|---|---|---|---|---|
| Indium | Ex. 8 | 19.0 | 19.0 | 0.0 | 1.10 | 1.10 |
| | Ex. 9 | 19.0 | 18.9 | −0.1 | 1.12 | 1.10 |
| Boron | C. Ex 4 | 18.9 | 18.4 | −0.5 | 1.10 | 1.20 |
| | C. Ex5 | 19.0 | 18.5 | −0.5 | 1.11 | 1.22 |

The light induced degradation evaluations were performed on solar cells fabricated from indium-doped monocrystalline silicon wafers and solar cells fabricated from boron-doped monocrystalline silicon wafers that were selected to be closely matched in oxygen concentration and dopant concentration. The solar cells fabricated from indium-doped wafers showed substantially reduced light induced degradation after illumination compared to the solar cells fabricated from boron-doped wafers. More specifically, the efficiency of the solar cells fabricated from indium-doped wafers remained at or very near 19% after illumination, compared to absolute degradation of about 0.5% for the boron-doped cells. In view of these results, solar cells fabricated from indium-doped cells exhibited substantially less light induced degradation than solar cells fabricated from boron-doped cells.

Example 12. Effect of Light Induced Degradation on Minority Carrier Lifetime of Solar Cells Fabricated from Indium-Doped Monocrystalline Silicon Wafers and Solar Cells Fabricated from Boron-Doped Monocrystalline Silicon Wafers Three groups of wafers were chosen from three different crystals. Each group of wafers was from the same segment. There are four wafers in each group. The first group of wafers was sliced from a high lifetime boron doped continuous Cz segment. The second group of wafers was sliced from an average lifetime boron doped continuous Cz segment. The third group of wafers was sliced from an indium doped Cz crystal.

All of the wafers were etched and cleaned at the same time in the same containers. The initial saw damage removal and texture etching step removed approximately 16 microns from each wafer. The wafers were cleaned after texture etching and were immediately passivated with iodine—ethanol solution after the final hydrofluoric (HF) acid cleaning step. Lifetime measurements were made on iodine-ethanol passivated wafers before and after the wafers were light soaked outdoors for six days. The Sinton WCT-120 wafer tool was used in Transient mode to make injection level lifetime measurements. The wafers were etched and cleaned in the same way prior to making the lifetime measurements after outdoor light soaking. The only difference was approximately 12 microns of material was removed from each wafer after light soaking.

Figure 9:
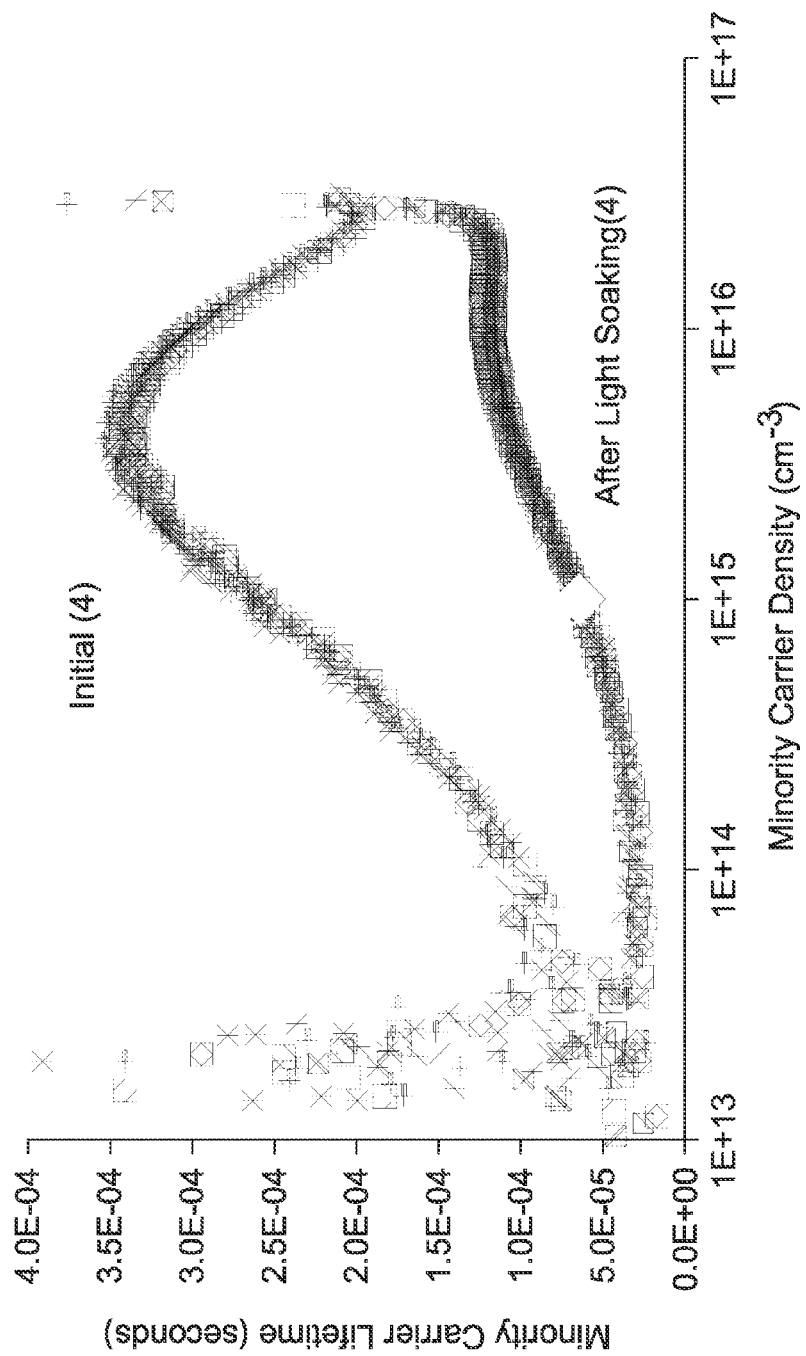
FIG. 9 is a graph depicting the minority carrier lifetime in a high lifetime, boron doped wafer both before and after light soaking (P01GJ-A4). The minority carrier lifetime data were obtained according to the method described in Example 12.
Figure 10:
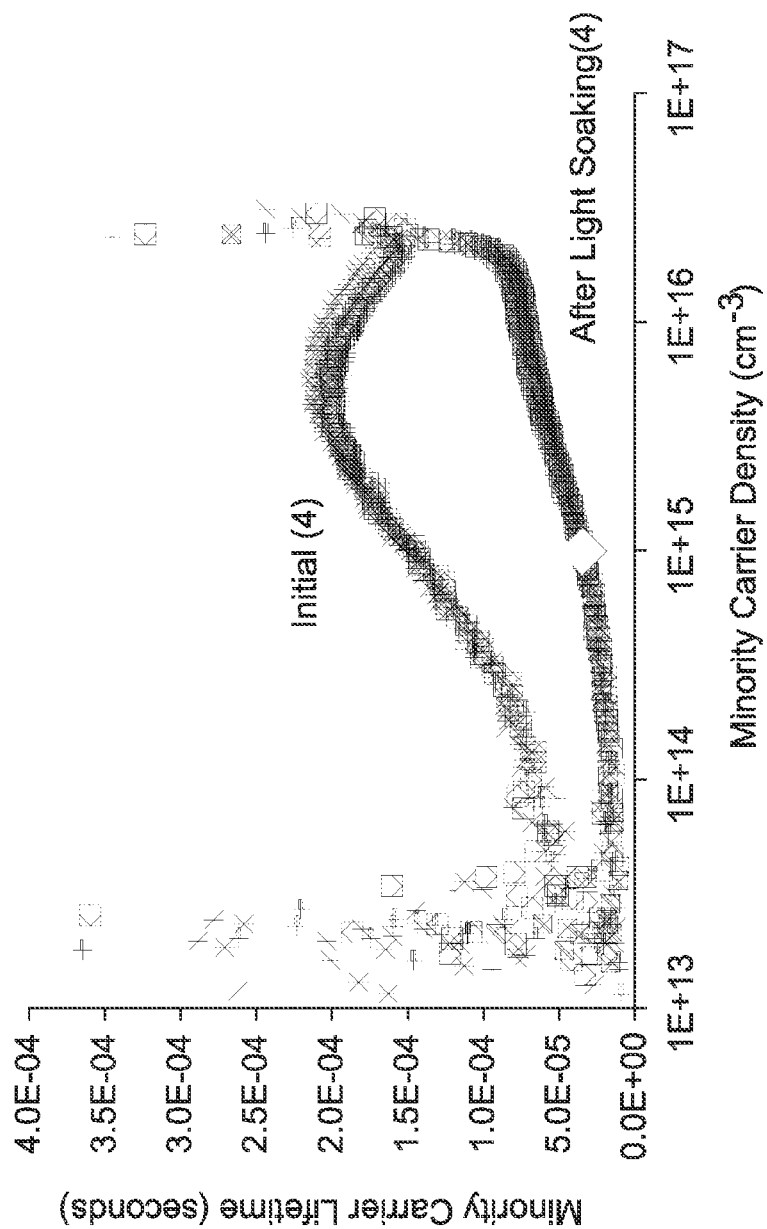
FIG. 10 is a graph depicting the minority carrier lifetime in an average lifetime, boron doped wafer both before and after light soaking (P00PC-C2). The minority carrier lifetime data were obtained according to the method described in Example 12.
Figure 11:
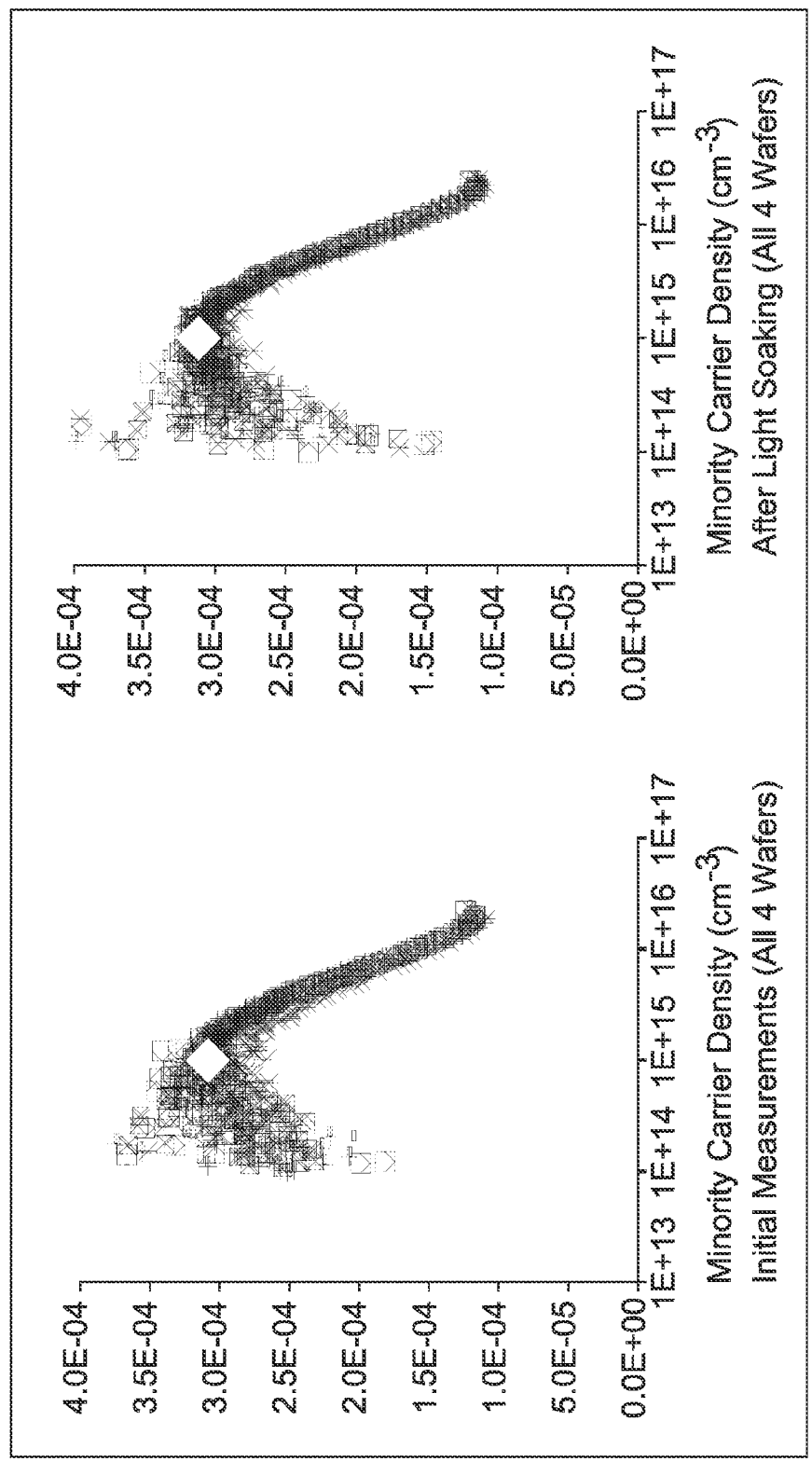
FIG. 11 is a graph depicting the minority carrier lifetime before and after light soaking (210T0N). The minority carrier lifetime data were obtained according to the method described in Example 12.
Figure 12:
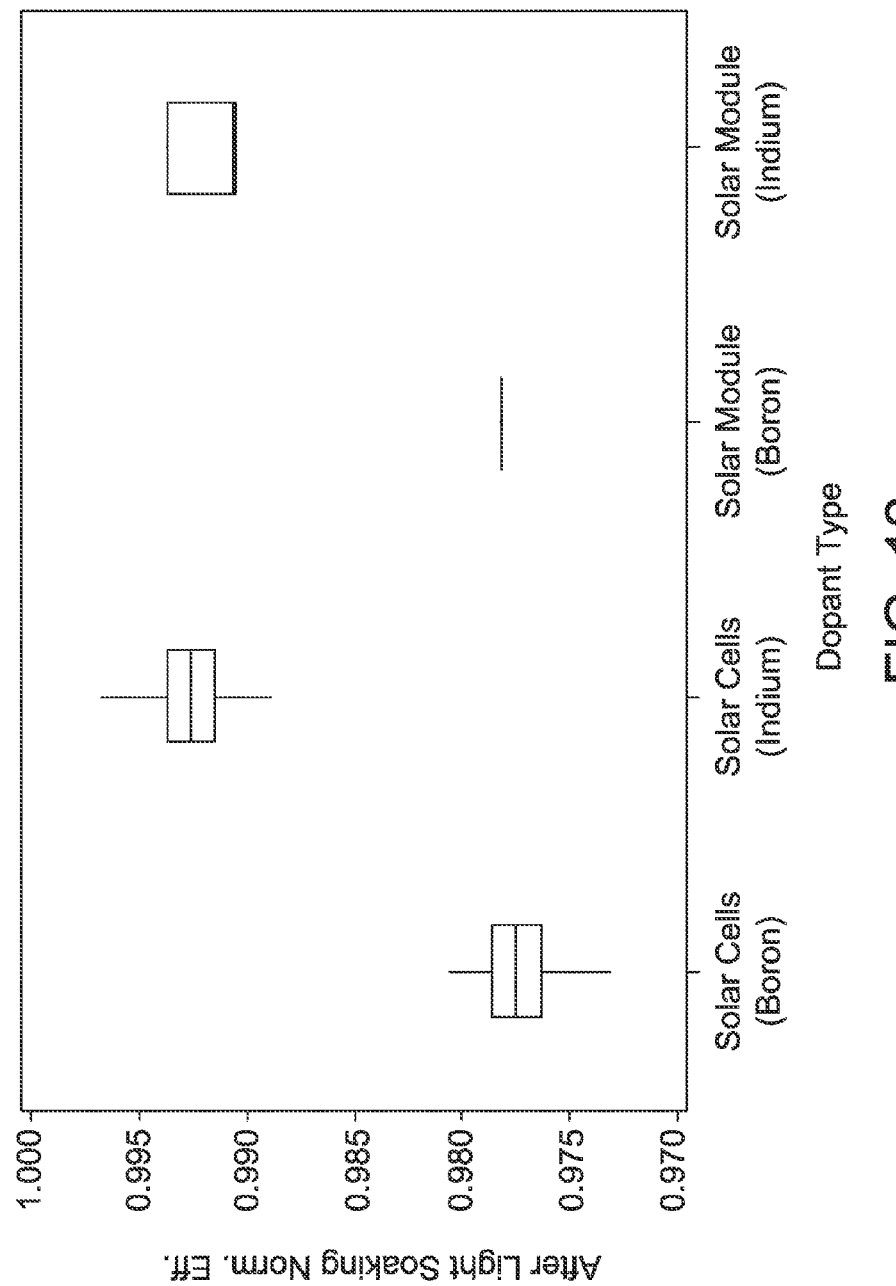
FIG. 12 is a boxplot depicting the normalized solar cell and module efficiency of boron and indium based solar cells and modules after outdoor light soaking. These data were obtained according to the method described in Example 13.
Figure 13:
FIG. 13 is a boxplot depicting the normalized open circuit voltage of boron and indium based solar cells and modules after outdoor light soaking. These data were obtained according to the method described in Example 13.
Figure 14:
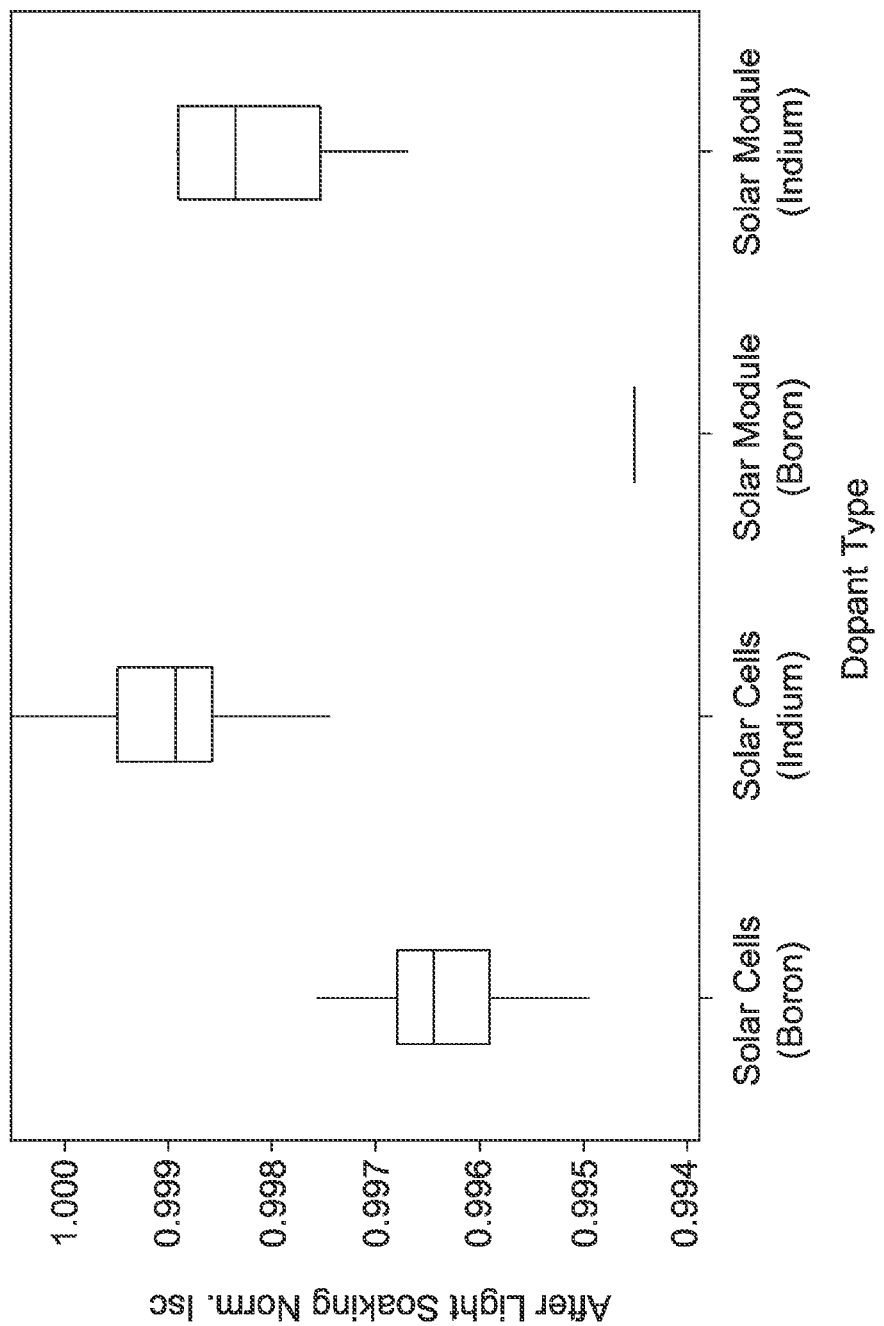
FIG. 14 is a boxplot depicting the normalized short circuit current of boron and indium based solar cells and modules after outdoor light soaking. These data were obtained according to the method described in Example 13.
Figure 15:
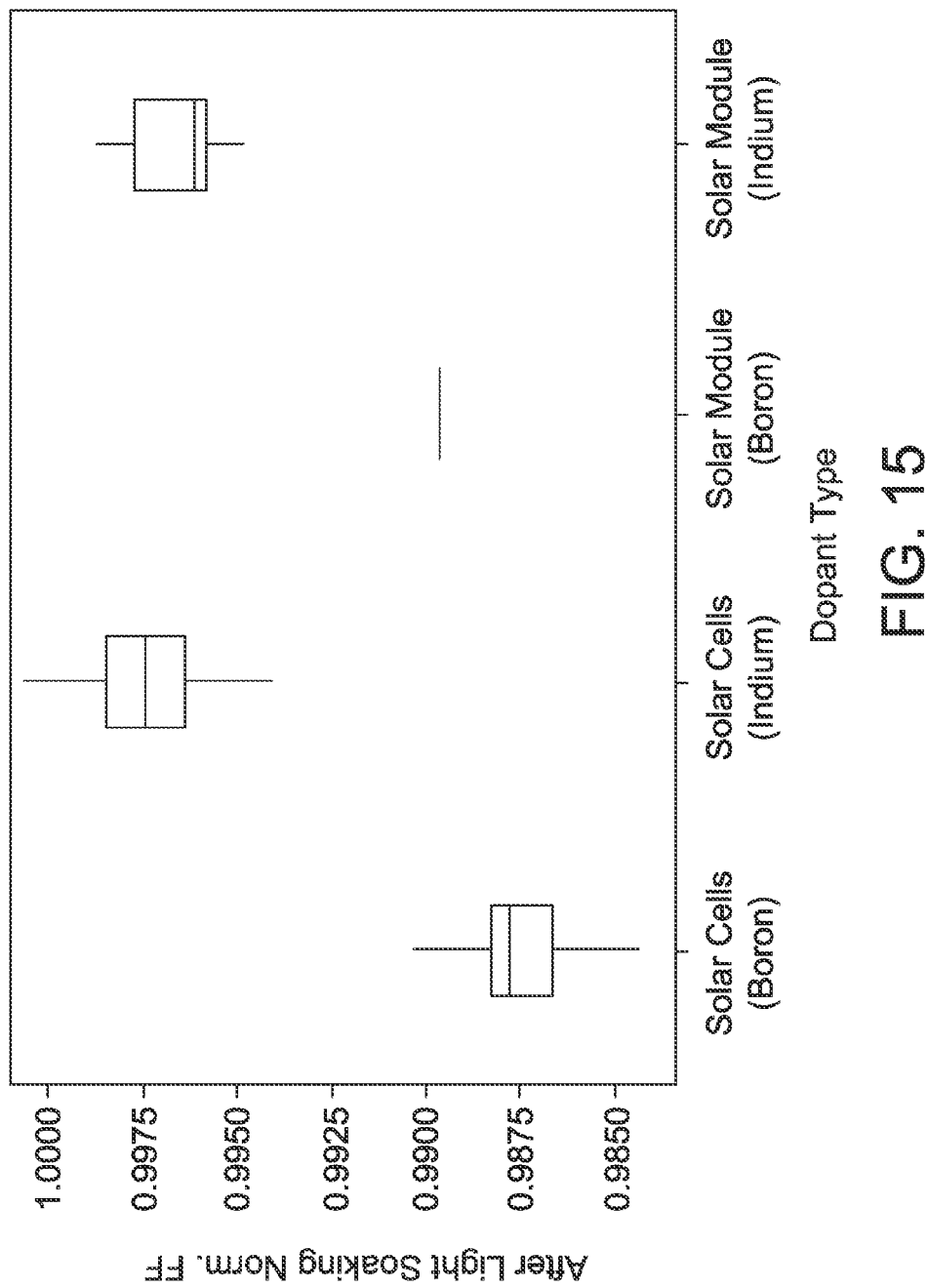
FIG. 15 is a boxplot depicting the normalized fill factor of boron and indium based solar cells and modules after outdoor light soaking. These data were obtained according to the method described in Example 13.

The crystal segment lifetime and resistivity for all three groups is shown in Table 16. The lifetime was measured at MCD=5e14 cm$^{-3}$ using Sinton Instruments BCT-400. The injection level lifetime for all four P01GJ-A4 (high lifetime, boron doped) wafers are shown in FIG. 9 before and after outdoor light soaking for six days. The injection level lifetime for all four P00PC-C2 wafers (average lifetime, boron doped) are shown in FIG. 10 before and after outdoor light soaking for six days. The injection level lifetime for all four 210T0N wafers (indium doped) are shown in FIG. 11 before and after outdoor light soaking for six days.

TABLE 16

Crystal Data for All Three Groups of Wafers.

| | Seed End | Opposite End |
|---|---|---|
| P01GJ - A4 (Boron CCz) | 898.37 µs | 859.65 µs |
| | 2.55 Ω-cm | 2.55 Ω-cm |
| P00PC - C2 (Boron CCz) | 208.20 µs | 156.90 µs |
| | 2.10 Ω-cm | 2.05 Ω-cm |
| 210T0N (Indium Cz) | 310.9 µs | 227.8 µs |
| | 3.25 Ω-cm | 2.80 Ω-cm |

A comparison of the minority carrier lifetime measured at an injection level (MCD) of 1e15 cm$^{-3}$ of all 12 wafers is shown in Table 17.

TABLE 17

Lifetime Comparison Between Boron and Indium Doped Silicon Wafers

| | Wafer # | Initial | After Light Soaking (6 Days Outdoors) |
|---|---|---|---|
| P01GJ-A4 | 1 | 255 µs | 64 µs |
| (~3.0 Ω-cm) | 2 | 264 µs | 62 µs |
| | 3 | 256 µs | 63 µs |
| | 4 | 269 µs | 64 µs |
| P00PC-C2 | 1 | 144 µs | 33 µs |
| (~2.2 Ω-cm) | 2 | 146 µs | 34 µs |
| | 3 | 146 µs | 35 µs |
| | 4 | 149 µs | 34 µs |
| 210T0N | 1 | 314 µs | 308 µs |
| (~3.1 Ω-cm) | 2 | 313 µs | 307 µs |
| | 3 | 282 µs | 293 µs |
| | 4 | 308 µs | 311 µs |

The minority carrier lifetime of indium doped Cz wafers does not degrade after exposure to sunlight for 6 days, while the minority carrier lifetime of boron doped CCz wafers does degrade. The LID test on boron and indium doped silicon wafers, where minority carrier lifetime is the measureable performance parameter, corresponds to the solar cell efficiency data on solar cells made on indium doped Cz silicon and boron doped CCz silicon wafers. In particular, the efficiency of solar cells made on indium doped Cz wafers does not degrade after light exposure, while solar cells made on boron doped CCz do exhibit light induced degradation.

A silicon solar cell's efficiency is related to the silicon wafer's minority carrier lifetime. The equations below pertain to an ideal semiconductor diode with no electric recombination in the space charge region. A more general formulation can be made, but the overall relationships can be demonstrated with an ideal diode model. Solar cell efficiency is given by equation 9.

$$\eta = \frac{V_{OC} I_{SC} FF}{P_{in}} \qquad \text{Eq. 9}$$

In equation 9, $V_{oc}$ is the open circuit voltage of the solar cell, $I_{sc}$ is the short circuit current, FF is the diode fill factor, and $P_{in}$ is the power density of the illumination incident on the solar cell. $P_{in}$ is 1 kW/m² for the AM1.5 solar spectrum.

$V_{oc}$ is a strong function of the base silicon's minority carrier diffusion length. The function of the open circuit voltage for an ideal diode is given in equation 10.

$$V_{OC} = \frac{kT}{q} \ln\left(\frac{I_L}{I_0} + 1\right) \qquad \text{Eq. 10}$$

In equation 10, k is Boltzmann's constant, T is the temperature, q is the fundamental charge of an electron, $I_L$ is the electric current generated due to illumination, and $I_0$ is the saturation current of the solar cell assuming an ideal p-n junction. The open circuit voltage is related to the minority carrier diffusion length via the saturation current of the solar cell, which is given in equation 11.

$$I_0 = A\left(\frac{qD_e n_i^2}{L_e N_A} + \frac{qD_h n_i^2}{L_h N_D}\right) \qquad \text{Eq. 11}$$

In equation 11, A is the area of the solar cell, $D_{e,h}$ is the diffusivity constant of electrons and holes respectively, $N_A$ is the number of dopant acceptors, $N_D$ is the number of dopant donors, and $L_{e,h}$ is the diffusion length of electrons and holes respectively. In a standard industrial solar cell, a p-type silicon wafer is used and a junction is made with a heavily doped n-type emitter. For this electronic structure, the second term in equation 11 is significantly smaller than the first term, and can be ignored. All of the variables in the first term are fixed by the process or are physical constants except the diffusion length of electrons. Since this is a p-type material, $L_e$ is the minority carrier diffusion length. This parameter has been used as a measure of crystalline perfection. It represents the average distance a minority carrier will travel in a crystal before recombining with a majority carrier. Its value is affected by many crystal properties such as metallic impurities, crystal defects (dislocations, vacancies, etc.), intentional impurities (dopants), and other defects. The minority carrier diffusion length is related to the minority carrier lifetime via the diffusivity constants of the minority carrier. This relationship for electrons, which are the minority carrier in p-type silicon, is shown in equation 12.

$$L_e = \sqrt{D_e \tau_e} \qquad \text{Eq. 12}$$

$\tau_e$ is the minority carrier lifetime of electrons.

Consequently, a material with higher minority carrier lifetime will have a lower saturation current, which leads to greater open circuit voltage and solar cell efficiency.

Another important mechanism that higher minority carrier diffusion length improves solar cell efficiency can be seen in the $I_L$ term in equation 10. The illuminated current, $I_L$, of a solar cell is given by equation 13.

$$I_L = qAG(L_e + W + L_h) \qquad \text{Eq. 13}$$

G is the generation rate of electron—hole pairs for silicon. It is based on the how crystalline silicon absorbs light, and is spectrally dependent. W is the width of the depletion region of the solar cell's junction. The other variables have been previously explained. Equation 13 indicates that the electric current due to illumination primarily occurs within one diffusion length on either side of the depletion region. In a standard industrial solar cell, the depletion width can be considered small, less than 0.5 microns, and the thicknesses of the n-type diffused emitter region is shorter than the depletion width, the active region of electric current generation due to illumination will be one diffusion length into the p-type silicon wafer. The electron—hole pair recombination rate will be determined by the minority carriers, electrons in p-type silicon. This has two implications for solar cell efficiency. The first is that by increasing $I_L$, the $V_{oc}$ will increase, as described in equation 10. The second is that by increasing the minority carrier diffusion length the portion of the silicon wafer that will actively generate electron—hole pairs will increase, which will increase the short circuit current, $I_{sc}$.

Consequently, the minority carrier diffusion length, and by extension the minority carrier lifetime, is one of the most important material properties of a silicon wafer used as the base of solar cell. It is a measure of crystalline perfection, which has a significant effect on solar cell's open circuit voltage, $V_{oc}$. Also, it increases the electrically active volume of the base silicon wafer, which contributes to the solar cell's open circuit voltage, $V_{oc}$, and short circuit current, $I_{sc}$. Ultimately, silicon wafers with longer minority carrier lifetimes have better solar cell efficiencies provided they are in the same electronic structure, such as an industry standard diffused junction screen-printed solar cell. Therefore, by maintaining a wafer's minority carrier lifetime by replacing boron with indium, the solar cell's efficiency will not degrade because of illumination, and the efficiency of the solar cell after light exposure will be higher for solar cells fabricated on indium doped wafers.

Example 13. Comparative Testing of the effect of Light Induced Degradation on Minority Carrier Lifetime of Solar Cells and Modules Fabricated from Indium-Doped Monocrystalline Silicon Wafers and Solar Cells and Modules Fabricated from Boron-Doped Monocrystalline Silicon Wafers A population of solar cells was fabricated using production line equipment (by a large industrial solar cell manufacturer). Solar cells were fabricated on both boron-doped single crystalline silicon wafers and indium-doped single crystalline silicon wafers. The solar cells were initially measured on a Sinton Instruments FCT-400 light current vs. voltage tester. A total of 93 solar cells were measured, including 27 solar cells fabricated on boron-doped silicon wafers and 66 solar cells fabricated on indium-doped silicon wafers. The initial solar cell efficiency for both boron and indium based solar cell was between 19.1%-19.2%. After initial measurements, all 93 solar cells were simultaneously light soaked outdoors. Light soaking was done by leaving the solar cells outside at St. Peters, Mo. in autumn from 12:00 PM until 10:00 AM four days later.

Additionally, solar modules were fabricated from solar cells fabricated on indium-doped single crystal silicon wafers and boron-doped single crystal silicon wafers. Six modules were fabricated from indium-doped single crystal silicon wafers. One reference module was fabricated from boron-doped single crystal silicon wafers. The modules were fabricated using standard module materials (MEMC Singapore, Inc.). Each module was manufactured from 72 solar cells. These modules were subjected to light soaking by leaving the modules outside at Singapore until they were exposed to approximately 150 kW-hr/m² of total solar irradiance. To compare to the solar cell performance, solar module performance data after at a total irradiance exposure of approximately 20 kW-hr/m² was used.

After light soaking, all 93 solar cells were measured using the Sinton Instruments FCT-400 light current vs. voltage tester. The measurements of the most relevant performance parameters: solar cell efficiency, open circuit voltage, short circuit current, and fill factor, have been normalized to each solar cell's initial value. The starting value for each solar cell is one (1). The measurement after light soaking shows the normalized degradation. The normalized solar cell efficiency, open circuit voltage, short circuit current, and fill factor before and after light soaking are plotted in FIGS. 12, 13, 14, and 15, respectively. For comparison, the same performance parameters for the solar modules have also been included.

The average normalized performance parameters of the solar cells fabricated from boron-doped silicon wafers and indium-doped silicon wafers after light soaking are shown in the following Table 18. The normalized solar cell efficiency shown in FIG. 12 indicates that the solar cells fabricated on indium-doped silicon wafers degrade by less than 1%, while the solar cells fabricated on boron-doped silicon wafers degrade by more than 2%. The degradation for solar cells fabricated on boron-doped silicon wafers is significantly greater than solar cells fabricated on indium-doped silicon wafers and occurs in every performance parameter; $V_{oc}$, $I_{sc}$, and FF. The greatest difference between solar cells fabricated on indium-doped silicon wafers compared to solar cells fabricated on boron-doped silicon wafers can be seen in the fill factor. This is primarily a result of the injection level lifetime behavior of boron doped silicon after light soaking, which shows a dramatic drop in lifetime at all injection levels.

TABLE 18

Average Normalized Solar Cell Performance Parameters After Light Soaking

| | Number of Solar Cells | Average Normalized Efficiency | Average Normalized $V_{oc}$ | Average Normalized $I_{sc}$ | Average Normalized FF |
|---|---|---|---|---|---|
| Indium Solar Cells | 66 | 0.9926 ± 0.0018 | .9962 ± 0.0007 | 0.9990 ± 0.0009 | 0.9975 ± 0.0017 |
| Boron Solar Cells | 27 | 0.9774 ± 0.0017 | .9934 ± 0.0004 | 0.9963 + 0.0059 | 0.9875 ± 0.0014 |

In addition, the solar module LID performance displays almost the same behavior as the solar cell data. The only difference can be seen in the open circuit voltage. However, after longer sunlight exposure times (150 kW-hr/m²), the solar cell and module open circuit voltage data are closer.

Figure 16:
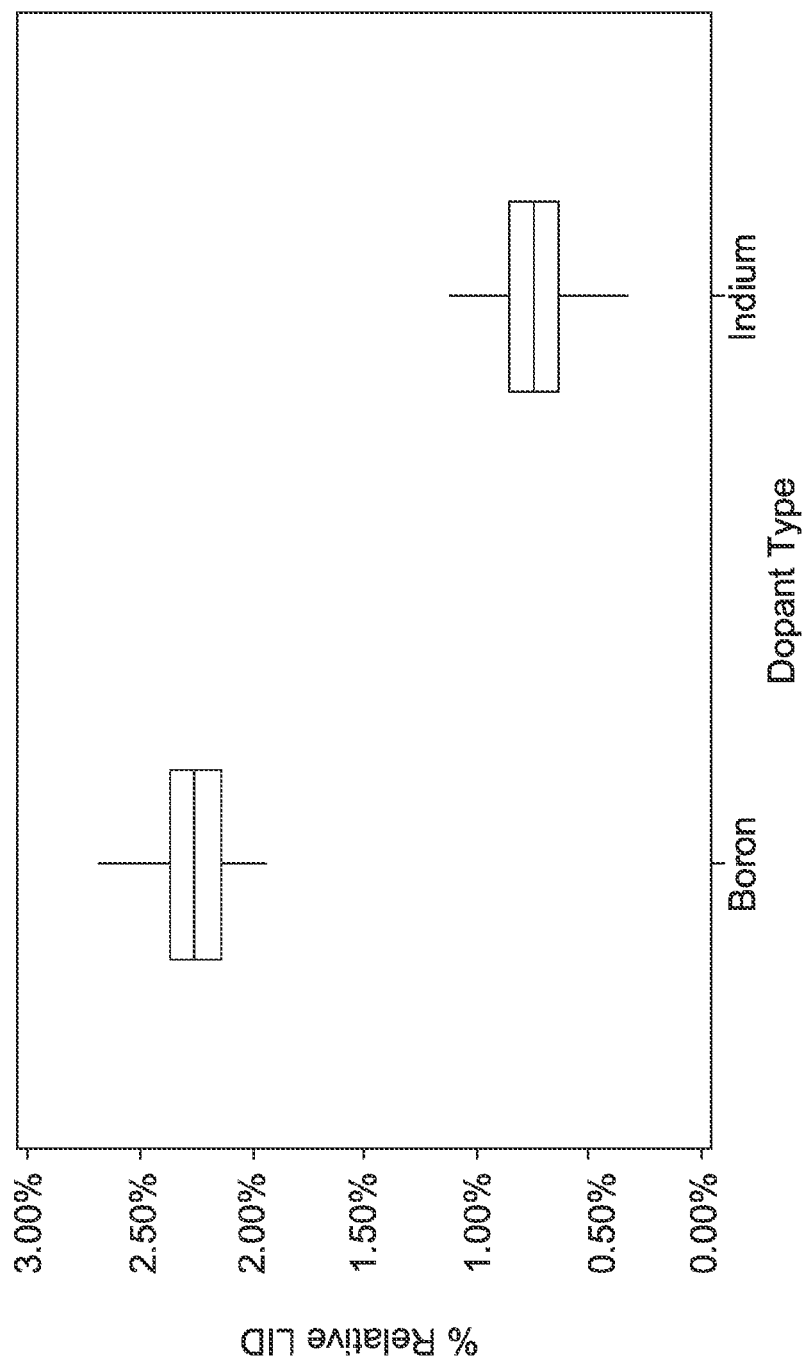
FIG. 16 is a boxplot depicting the % Relative LID of boron and indium based solar cells after outdoor light soaking. These data were obtained according to the method described in Example 13.
Figure 17:
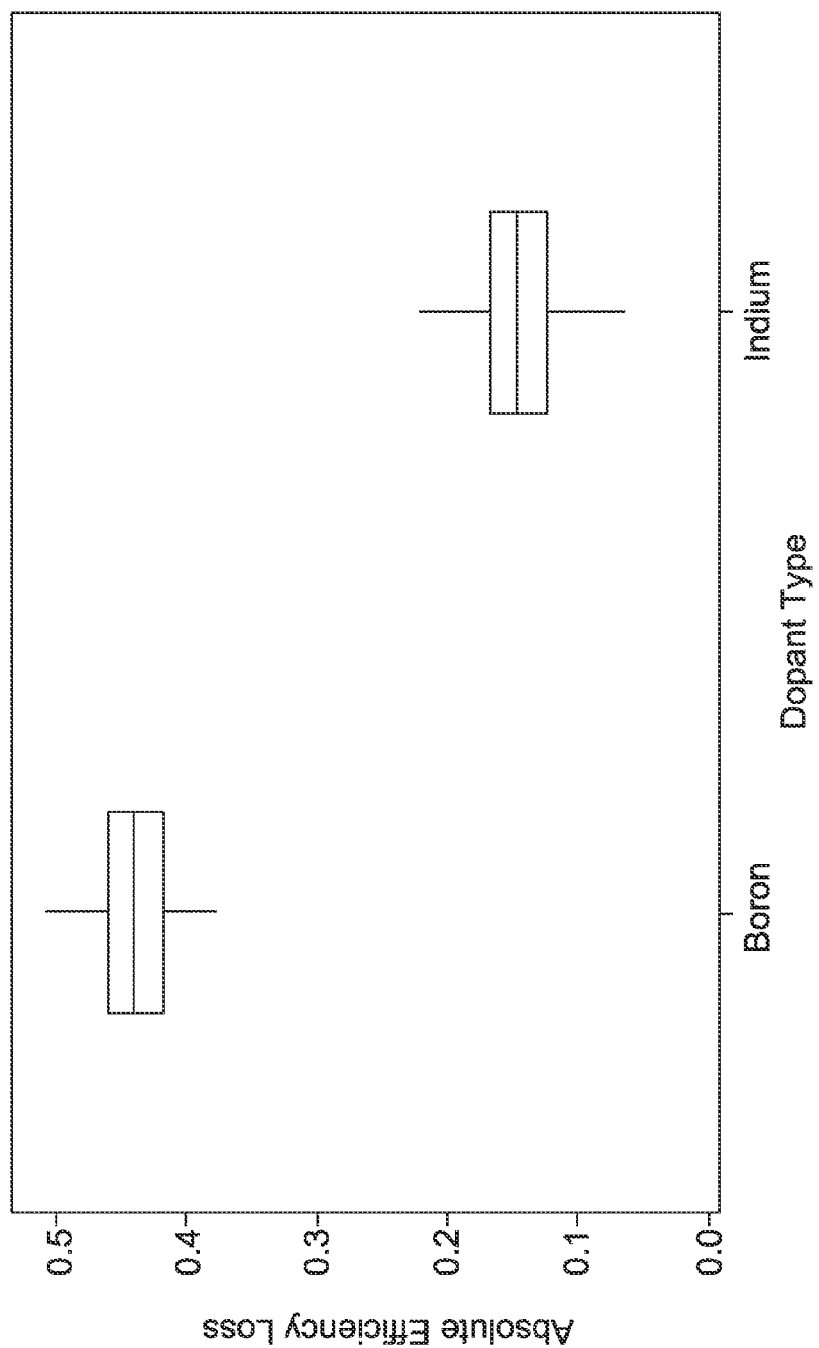
FIG. 17 is a boxplot depicting the absolute solar cell efficiency loss of boron and indium based solar cells after outdoor light soaking. These data were obtained according to the method described in Example 13.

The comparison of the solar cells fabricated on boron-doped silicon wafers and indium-doped silicon wafers made in a high volume manufacturing facility can also be shown in terms of percent relative LID and absolute efficiency loss. Both are typically used in the photovoltaic industry for reporting loss due light induced degradation. The percent relative LID and absolute efficiency loss for the solar cells fabricated on boron-doped silicon wafers and indium-doped silicon wafers are shown in FIGS. 16 and 17, respectively.

The outdoor light soaking test of industry standard diffused junction screen-printed silicon solar cells made in a high volume manufacturing solar cell line shows that the light induced degradation is significantly less for indium-doped silicon wafers compared to boron-doped silicon wafers. Furthermore, the magnitude of the degradation of the solar cells fabricated on boron-doped silicon wafers is significant, while there is a nearly negligible amount of degradation in the solar cells fabricated on indium-doped silicon wafers. Solar modules fabricated from the same groups of solar cells (fabricated from boron-doped silicon wafers and indium-doped silicon wafers) also performed similarly to the individual solar cells. Solar modules comprising solar cells fabricated on indium-doped silicon wafers showed an efficiency degradation of less than 1%, while solar modules comprising solar cells fabricated on boron-doped silicon wafers showed an efficiency degradation of greater than 2%.

As various changes could be made in the above-described process without departing from the scope of the disclosure, it is intended that all matters contained in the above description be interpreted as illustrative and not in a limiting sense. In addition, when introducing elements of the present disclosure or the embodiment(s) thereof, the articles "a," "an," "the" and "said" are intended to mean that there are one or more of the elements. The terms "comprising," "including" and "having" are intended to be inclusive and mean that there may be additional elements other than the listed elements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of growing a monocrystalline silicon ingot, the method comprising the steps of:
   providing a monocrystalline ingot growing apparatus including a chamber having an internal pressure, and a crucible disposed within the chamber;
   preparing a silicon melt in the crucible;
   introducing an inert gas into the chamber from a gas inlet above the silicon melt, wherein the inert gas flows over the surface of the silicon melt and has a flow rate;
   introducing a volatile dopant into the silicon melt, wherein the volatile dopant includes indium;
   growing an indium-doped monocrystalline silicon ingot, wherein the indium-doped monocrystalline silicon ingot has an indium dopant concentration; and
   controlling the indium dopant concentration in the ingot by adjusting the ratio of the inert gas flow rate and the internal pressure of the chamber, wherein controlling the indium dopant concentration in the ingot includes adjusting the ratio of the inert gas flow rate and the internal pressure of the chamber to obtain a desired effective evaporation rate of the volatile dopant according to the formula $$g^* = A\left(\frac{f}{p}\right) + B$$

where g* is an effective evaporation rate of the volatile dopant in the silicon melt, f is the inert gas flow rate, p is the internal pressure of the chamber, and A and B are each coefficients determined using a relationship between the effective evaporation rate of the volatile dopant in the silicon melt g* and the effective segregation coefficient of indium in silicon $k_e$ according to the formula:

$$g^* = (k_e - k)\frac{Hv}{\delta}$$

where k is a segregation coefficient of indium in silicon, H is a ratio of a melt volume to a free surface of the silicon melt, v is an average pull speed of a crystal puller, and δ is a liquid-to-solid density ratio of silicon, where $k_e$ is calculated from measurements taken from sections cut from grown indium-doped silicon ingots using the equation:

$$k_e = 1 + \frac{\log\left(\frac{C_a}{C_z}\right)}{\log\left(\frac{1-m_a}{1-m_z}\right)}$$

where Ca is a dopant concentration at a seed end of an ingot section being measured, Cz is a dopant concentration at a tail end of the ingot section being measured, $m_a$ is a solidified fraction of a silicon ingot at the seed end of the ingot section, and $m_z$ is a solidified fraction of the silicon ingot at a tail end of the ingot section.

2. The method as set forth in claim 1 wherein controlling the indium dopant concentration in the ingot includes adjusting at least one of the inert gas flow rate and the internal pressure of the chamber at at least one predetermined time during the growth of the indium-doped monocrystalline silicon ingot.

3. The method as set forth in claim 1 wherein controlling the indium dopant concentration in the ingot further includes selecting the desired effective evaporation rate of the volatile dopant based upon a desired resistivity profile in the ingot.

4. The method as set forth in claim 3 wherein controlling the indium dopant concentration in the ingot further includes selecting the desired effective evaporation rate of the volatile dopant based upon a desired indium dopant concentration in the silicon melt at a given time t during the growth process.

5. The method as set forth in claim 4 wherein the desired effective evaporation rate is selected according to the formula, $$C_l = C_{l,0} e^{-\left(\frac{g^*}{H}\right)t}$$

where $C_l$ is the desired indium dopant concentration in the silicon melt at a given time t during the growth process, $C_{l,0}$ is the initial indium dopant concentration in the silicon melt, g* is the effective evaporation rate of the indium dopant, and H is the ratio of the melt volume to a free surface of the melt.

6. The method as set forth in claim 1 wherein introducing a volatile dopant into the silicon melt includes introducing the volatile dopant as a liquid into the silicon melt.

7. The method as set forth in claim 1 wherein introducing a volatile dopant into the silicon melt includes introducing the volatile dopant as a solid into the silicon melt.

8. The method as set forth in claim 1 wherein the inert gas is selected from the group consisting of argon, helium, neon, and nitrogen.

9. The method as set forth in claim 1, wherein the inert gas flow rate is varied between about 20 normal-liters per minute and about 200 normal-liters per minute.

10. The method as set forth in claim 1, wherein the inert gas flow rate is varied between about 30 normal-liters per minute and about 140 normal-liters per minute.

11. The method as set forth in claim 1, wherein the inert gas flow rate is varied between about 30 normal-liters per minute and about 80 normal-liters per minute.

12. The method as set forth in claim 1, wherein the internal chamber pressure is varied between about 20 millibar and about 400 millibar.

13. The method as set forth in claim 1, wherein the internal pressure is varied between about 30 millibar and 200 millibar.

14. The method as set forth in claim 1, wherein the internal pressure is varied between about 30 millibar and 100 millibar.

15. The method as set forth in claim 1, wherein the method comprises a batch Czochralski growing method.

16. A monocrystalline silicon ingot having a central axis, a circumferential edge, a radius extending from the central axis to the circumferential edge, and a mass, the ingot comprising:
 a mean indium concentration of at least about $5 \times 10^{14}$ atoms per cubic centimeter; and
 an axial variance of indium concentration of less than about $5 \times 10^{14}$ atoms per cubic centimeter over an axial length of over 20 centimeters, wherein the radius of the ingot is greater than about 75 millimeters.

17. The monocrystalline silicon ingot as set claim 16, wherein the mass of the ingot is at least about 50 kilograms.

18. The monocrystalline silicon ingot as set claim 16 wherein the axial variance of indium concentration is no more than about $1 \times 10^{14}$ atoms per cubic centimeter over an axial over an axial length of over 20 centimeters.

19. The method as set forth in claim 6, wherein the monocrystalline ingot growing apparatus includes a liquid doping system including a dopant reservoir for holding dopant, a feeding tube having a first end extending from an opening of the reservoir, a second end distal from the first end, and a restriction for inhibiting the passage of solid dopant through the feeding tube, and wherein introducing the volatile dopant as a liquid includes:
 adding a predetermined amount of solid volatile dopant to the dopant reservoir;
 positioning the liquid doping system at a location sufficiently near the surface of the silicon melt so that the solid volatile dopant melts;
 melting the solid volatile dopant such that the solid volatile dopant becomes a liquid volatile dopant; and introducing the liquid volatile dopant into the silicon melt through the feeding tube of the liquid doping system.

20. The method as set forth in claim 19 wherein introducing a volatile dopant into the silicon melt as a liquid further includes restricting the liquid volatile dopant at the second end of the feeding tube and further heating the liquid dopant while the liquid volatile dopant is within the feeding tube prior to introducing the liquid volatile dopant into the silicon melt.

21. The method as set forth in claim 1, wherein the method comprises a continuous Czochralski growing method.

22. A method of growing a monocrystalline silicon ingot, the method comprising the steps of:
providing a monocrystalline ingot growing apparatus including a chamber having an internal pressure, and a crucible disposed within the chamber;
preparing a silicon melt in the crucible;
introducing an inert gas into the chamber from a gas inlet above the silicon melt, wherein the inert gas flows over the surface of the silicon melt and has a flow rate;
introducing a volatile dopant into the silicon melt, wherein the volatile dopant includes indium;
growing an indium-doped monocrystalline silicon ingot, wherein the indium-doped monocrystalline silicon ingot has an indium dopant concentration; and
controlling the indium dopant concentration in the ingot by adjusting the ratio of the inert gas flow rate and the internal pressure of the chamber, wherein controlling the indium dopant concentration in the ingot includes adjusting the ratio of the inert gas flow rate and the internal pressure of the chamber to obtain a desired effective evaporation rate of the volatile dopant according to the formula $$g^* = A\left(\frac{f}{p}\right) + B$$

where $g^*$ is an effective evaporation rate of the volatile dopant in the silicon melt, f is the inert gas flow rate, p is the internal pressure of the chamber, and A and B are each coefficients determined using a relationship between an effective evaporation rate of indium and an effective segregation coefficient of indium in silicon.

* * * * *